United States Patent

Harada et al.

[11] Patent Number: 5,966,294
[45] Date of Patent: Oct. 12, 1999

[54] PRINTED CIRCUIT BOARD FOR PREVENTION OF UNINTENTIONAL ELECTROMAGNETIC INTERFERENCE

[75] Inventors: Takashi Harada; Hideki Sasaki, both of Tokyo, Japan

[73] Assignee: NEC Corporation, Tokyo, Japan

[21] Appl. No.: 08/991,895

[22] Filed: Dec. 16, 1997

[30] Foreign Application Priority Data

Dec. 20, 1996 [JP] Japan .................................. 8-342180

[51] Int. Cl.⁶ ........................................................ H05K 7/02
[52] U.S. Cl. .......................... 361/794; 361/818; 361/816; 361/820; 361/738; 361/736; 257/750; 257/759; 257/773; 257/774; 174/250; 174/255
[58] Field of Search ..................... 361/794, 818, 361/816, 820, 736, 738, 735, 744; 174/250, 255, 258; 257/759, 750, 758, 773, 774

[56] References Cited

U.S. PATENT DOCUMENTS

| 5,185,502 | 2/1993 | Shepherd et al. | 174/262 |
|---|---|---|---|
| 5,336,855 | 8/1994 | Kahlert et al. | 174/250 |
| 5,384,691 | 1/1995 | Neugebauer et al. | 361/794 |
| 5,863,447 | 1/1999 | Coteus et al. | 216/17 |
| 5,875,100 | 2/1999 | Yamashita | 361/794 |

FOREIGN PATENT DOCUMENTS

| 59-146999 | 10/1984 | Japan . |
|---|---|---|
| 60-71174 | 5/1985 | Japan . |
| 2-26294 | 2/1990 | Japan . |
| 2-68571 | 3/1990 | Japan . |
| 3-150895 | 6/1991 | Japan . |
| 3-273699 | 12/1991 | Japan . |
| 5-243782 | 9/1993 | Japan . |
| 5-76083 | 10/1993 | Japan . |
| 6-69680 | 3/1994 | Japan . |
| 6-132668 | 5/1994 | Japan . |
| 7-302956 | 11/1995 | Japan . |
| 7-321470 | 12/1995 | Japan . |
| 9-246776 | 9/1997 | Japan . |
| 10-163636 | 6/1998 | Japan . |

OTHER PUBLICATIONS

Y. Akiba, Proceedings of the 10th Japan Institute for Interconnecting and Packaging Electronic Circuits Annual Meeting, 15B–12, pp. 175–176.

*Primary Examiner*—Leo P. Picard
*Assistant Examiner*—David Foster
*Attorney, Agent, or Firm*—Young & Thompson

[57] ABSTRACT

There is provided a printed circuit board including (a) at least one dielectric layer, (b) at least two metal layers one of which acts as a ground layer, another one of which acts as a power-supplying layer, and the others of which, if any, act as a wiring layer in which a signal pattern is formed, the dielectric layer and the metal layers being alternately formed one on another, and (c) at least one resistor disposed at a marginal end of the printed circuit board between the ground layer and the power-supplying layer, the resistor having a function of disallowing current communication between the ground layer and the power-supplying layer. The above-mentioned printed circuit board prevents fluctuation in a voltage between ground and a power-supply, and further prevents unintentional electromagnetic interference and circuit malfunction caused by invasion of external electromagnetic field thereinto.

40 Claims, 11 Drawing Sheets

PRINTED CIRCUIT BOARD FOR PREVENTION OF UNINTENTIONAL ELECTROMAGNETIC INTERFERENCE

BACKGROUND OF THE INVENTION

1. Field of the Invention

The invention relates to a multi-layered printed circuit board including two or more layers therein, used for an electronic device such as a data processing apparatus and a communication apparatus, and more particularly to such a printed circuit board capable of preventing unintentional electromagnetic interference and also depressing circuit malfunction caused by electromagnetic noises intruding thereto from outside.

2. Description of the Related Art

With recent development of network system, various problems are posed such as unintentional electromagnetic interference (EMI) generated by operation of electronic devices such as a data processing device and communication device, interference to other radio-communication systems by such EMI, and malfunction of electronic devices caused by intrusion of external electromagnetic waves thereinto.

In order to overcome those problems, electronic devices are sealed, for instance, with a filter for preventing electromagnetic interference from emitting therefrom and external electromagnetic waves from intruding thereinto. To seal a printed circuit board on which an electronic circuit, a major part of an electronic device, is mounted brings an advantage in terms of a cost, and hence various attempts have been made for that purpose.

For instance, one of conventional multi-layered printed circuit boards has been suggested in Japanese Unexamined Patent Publication No. 5-243782. FIG. 1 is a cross-sectional view of the suggested multi-layered printed circuit board. A multi-layered printed circuit board 101 includes a signal transmission layer 102, an internal earth layer 104 located above the signal transmission layer 102, an earth layer 105 located above the signal transmission layer 102, and an insulator 103 filled between an upper surface layer 100 and the earth layer 105. An amplifier circuit 99 is mounted on the upper surface layer 100.

Japanese Unexamined Utility Model Publication No. 60-71174 has suggested another multi-layered printed circuit board. As illustrated in FIG. 2, the suggested multi-layered printed circuit board 106 includes power-supplying lines 109 and 110 connected to a power-supply, a plurality of insulating substrates 108 deposited one on another between the power-supplying lines 109 and 110, and signal layers 107 (shown with a broken line) electrically connecting elements, mounted on the printed circuit board 106, with each other. The signal layers 107 are formed in the insulating substrates 107 to thereby isolate the signal layers 107 from circumstances.

FIG. 3 illustrates a multi-layered printed circuit board suggested in Japanese Unexamined Utility Model Publication No. 5-76083. The suggested printed circuit board 111 includes a pair of outer surface layers 140, and signal pattern layers 141a, 141b, 141c and 141d formed between the outer surface layers 140. The outer surface layers 140 are designed to have a ground pattern or a solid pattern in order to act as a shield, thereby preventing emission of electromagnetic waves from the signal pattern layers 141a to 141d.

FIG. 4 illustrates a multi-layered printed circuit board suggested in Japanese Unexamined Patent Publication No. 2-68571. The suggested printed circuit board 112 includes a first insulating layer 142, a first signal pattern layer 143, a second insulating layer 144, a second signal pattern layer 145, a substrate 146, and a shield layer 113, deposited in this order. A device 147 is mounted on the shield layer 113, but is designed to make no electrical communication with the shield layer 113.

FIG. 5 illustrates a multi-layered printed circuit board suggested in Japanese Unexamined Utility Model Publication No. 59-146999. In accordance with the suggested printed circuit board 114, signal layers 116 are sandwiched between ground or power-supplying layers 115.

FIG. 6 illustrates a structure for packaging an electronic device therein suggested in Japanese Unexamined Utility Model Publication No. 2-26294. A transformer 148 comprising a core 149 and a coil 150 wound around the core 149 is placed in a case 151. On the transformer 148 is mounted a multi-layered printed circuit board 121. The multi-layered printed circuit board 121 is designed to have a lowermost layer as a shield layer 122. Since the shield layer 122 is located closest to the core 149 or a source of emission of electromagnetic waves, the shield layer 122 shuts out noises derived from the core 149.

FIG. 7 illustrates a structure for packaging an electronic device therein suggested in Japanese Unexamined Patent Publication No. 6-69680. A multi-layered printed circuit board 124 is designed to have outer surface layers as shield layers 125a and 125b. The multi-layered printed circuit board 124 is mounted in a metal box 126 to thereby define a space between the printed circuit board 124 and a bottom surface of the metal box 126. A source 127a of emission of high frequency electromagnetic waves and a circuit 127b are disposed in the space to thereby shield EMI source.

FIG. 8 is a top plan view illustrating a printed circuit board suggested in Japanese Unexamined Patent Publication No. 7-302956. The illustrated printed circuit board has a substrate 128 on which conductors 130A and 130B are formed at a marginal end thereof, both of which define a rectangular-shaped conductor. A plurality of conductors 130D extend in a lengthwise direction of the rectangular conductor 130A and 130B, and a plurality of intermediate conductors 130E extend in the same direction between the conductors 130D. On the substrate 128 are formed an oscillator 152, and integrated circuits 153a and 153b. The oscillator 152 and the integrated circuits 153a, 153b are electrically connected to one another by a clock line 154. The substrate 128 is formed with a rectangular opening 129 having a width $W_1$ and located at a distance $L_4$ from the conductor 130A. The rectangular opening 129 divides the intermediate conductors 130E into pieces, and hence define a non-conductive region. The rectangular opening 129 is located remote from the conductors 130A and 130B by a distance of one-fourth or greater of lengths of the conductors 130A and 130B, respectively.

FIG. 9 illustrates a multi-layered printed circuit board suggested by Y Akiba, Proceedings of the 10th Japan Institute for Interconnecting and Packaging Electronic Circuits Annual Meeting, 15B-12, pp. 175–176. The illustrated printed circuit board 131 includes first and second ground layers 132 and 133 between which is interposed a resistor 135. A power-supplying layer 160 is sandwiched between the ground layers 132 and 133. A dielectric substance 161 disposed between the ground layers 132 and 133 is designed to have a dielectric constant $\epsilon_1$ greater than $\epsilon_2$ of other dielectric substance 162 disposed between the power-supplying layer 3 and the ground layer 133 in order to obtain a great capacity between the power-supplying layer 3 and the ground layer 132.

There are two major factors for unintentional electromagnetic interference from a printed circuit board and malfunction of a circuit caused by intrusion of external electromagnetic field thereinto. One of them is a loop defined by a signal wiring pattern and a ground pattern, and the other is fluctuation in voltage between a power-supply and ground.

The printed circuit boards illustrated in FIGS. 1 to 5 attempt to prevent unintentional electromagnetic interference and intrusion of external electromagnetic field both caused by the firstly mentioned factor, namely a loop defined by a signal wiring pattern and a ground pattern. Those printed circuit boards attempt to electrically shield a loop defined by a signal wiring pattern and a ground pattern by the ground layer formed all over a substrate, the ground pattern partially formed on a substrate, or the signal wiring pattern sandwiched between metal plates having the same potential as that of a power-supplying layer and a power-supplying pattern layer. However, those printed circuit boards have a problem that layers having the same potential as that of ground or a power-supply have to be additionally formed for sandwiching a signal wiring pattern layer therebetween.

The printed circuit board illustrated in FIGS. 6 and 7 are designed to have a layer or layers as an entire ground layer or as a shield plate to thereby define a space between the shield plate and a metal housing. A high frequency circuit which is a source of EMI is placed in the space to thereby prevent EMI therefrom and intrusion of external electromagnetic waves thereinto.

However, in the above-mentioned structure where a layer or layers of the printed circuit board cooperate(s) with a housing to thereby define a shield, the printed circuit board has to be fabricated so as to be able to assemble with a particular housing. Hence, the printed circuit board one fabricated to do so cannot be applied to existing housings.

The printed circuit board illustrated in FIG. 8 divides the power-supplying pattern and ground pattern into pieces by means of the intermediate non-conductors 129 to thereby prevent resonance caused in dependence on a length of those patterns. However, if the power-supplying pattern or a ground pattern were designed to entirely cover a substrate therewith, the non-conductors 129 inversely act as a slit antenna, resulting in increased EMI.

The multi-layered printed circuit board illustrated in FIG. 9 incorporates the resistor 135 as loss material into a high frequency circuit defined by the first and second ground layers 132, 133 and the power-supplying layer 160 to thereby prevent EMI and malfunction of devices both caused by fluctuation in a voltage between the power-supplying layer 160 and the first and second ground layers 132, 133. However, the printed circuit board has a problem that an additional ground layer has to be formed other than an ordinary ground layer, resulting in an increase in fabrication cost.

SUMMARY OF THE INVENTION

In view of the foregoing problems of the conventional multi-layered printed circuit boards, it is an object of the present invention to provide a multi-layered printed circuit board capable of preventing fluctuation in a voltage between a power-supply and ground, and further preventing unintentional electromagnetic interference and malfunction of devices caused by intrusion of external electromagnetic field thereinto.

There is provided a printed circuit board including (a) at least one dielectric layer, (b) at least two metal layers one of which acts as a ground layer, another one of which acts as a power-supplying layer, and the others of which, if any, act as a wiring layer in which a signal pattern is formed, the dielectric layer and the metal layers being alternately formed one on another, and (c) at least one resistor disposed at a marginal end of the printed circuit board between the ground layer and the power-supplying layer, the resistor having a function of disallowing d.c. current communication between the ground layer and the power-supplying layer.

When a plurality of wiring layers are sandwiched between the ground layer and the power-supplying layer, signal patterns of the wiring layers may be formed in a limited area within the wiring layers, the resistor being formed outside the limited area between the ground layer and the power-supplying layer.

There is further provided a printed circuit board including (a) at least one dielectric layer, (b) at least two metal layers one of which acts as a ground layer, another one of which acts as a power-supplying layer, and the others of which, if any, act as a wiring layer in which a signal pattern is formed, the dielectric layer and the metal layers being alternately formed one on another, and (c) a multi-layered structure disposed at a marginal end of the printed circuit board between the ground layer and the power-supplying layer, the multi-layered structure having a function of disallowing d.c. current communication between the ground layer and the power-supplying layer, the multi-layered structure comprising a compound layer and a dielectric layer both of which are alternately deposited, the compound layer comprising a resistive layer, and metal layers sandwiching the resistive layer therebetween.

The above-mentioned resistor or multi-layered structure may have no electrical communication with the ground layer and the power-supplying layer, or have electrical communication with only one of the ground layer and the power-supplying layer.

The power-supplying layer is comprised of either a single layer or a plurality of sections. In the latter case, the resistor or multi-layered structure is arranged at a marginal end of each of the sections.

For instance, the resistor or multi-layered structure may have a closed shape extending along an entire outer edge of the printed circuit board.

There is still further provided a printed circuit board including (a) at least one dielectric layer, (b),at least two metal layers one of which acts as a ground layer, another one of which acts as a power-supplying layer, and the others of which, if any, act as a wiring layer in which a signal pattern is formed, the dielectric layer and the metal layers being alternately formed one on another, (c) a resistive film extending from an upper surface to a lower surface through a sidewall of the printed circuit board, (d) pads formed on the upper and lower surfaces of the printed circuit board, and (e) a capacitor formed on one of the upper and lower surfaces of the printed circuit board, the ground layer and the power-supplying layer being in electrical communication with each of the pads through via-holes at a marginal end of the printed circuit board, the resistive film being in electrical communication with one of the pads through the capacitor, and being in direct electrical communication with the other of the pads.

The printed circuit board may further include an additional capacitor formed on the other of the upper and lower surfaces of the printed circuit board, in which case the resistive film is in electrical communication with the pads through the capacitor and the additional capacitor, respectively. As an alternative, the printed circuit board may further include a short-circuit board formed on the other of the upper and lower surfaces of the printed circuit board, in which case the resistive film is in electrical communication with the pads through the capacitor and the short-circuit board, respectively.

It is preferable that the capacitor has a parasitic inductance small enough to prevent reduction in current running through the resistive film.

There is yet further provided a printed circuit board including (a) at least one dielectric layer, (b) at least two metal layers one of which acts as a ground layer, another one of which acts as a power-supplying layer, and the others of which, if any, act as a wiring layer in which a signal pattern is formed, the dielectric layer and the metal layers being alternately formed one on another, (c) a resistor formed on a sidewall of the printed circuit board, (d) pads formed on upper and lower surfaces of the printed circuit board, and (e) a capacitor formed on one of the upper and lower surfaces of the printed circuit board, the ground layer and the power-supplying layer being in electrical communication with each of the pads through via-holes at a marginal end of the printed circuit board, the resistor being in electrical communication with one of the pads through the capacitor, and being in direct electrical communication with the other of the pads. multi-layered structure The printed circuit board may further include an additional capacitor formed on the other of the upper and lower surfaces of the printed circuit board, in which case, the resistor is in electrical communication with the pads through the capacitor and the additional capacitor, respectively. As an alternative, the printed circuit board may further include a short-circuit board formed on the other of the upper and lower surfaces of the printed circuit board, in which case, the resistor is in electrical communication with the pads through the capacitor and the short-circuit board, respectively.

There is still yet further provided a printed circuit board including (a) at least one dielectric layer, (b) at least two metal layers one of which acts as a ground layer, another one of which acts as a power-supplying layer, and the others of which, if any, act as a wiring layer in which a signal pattern is formed, the dielectric layer and the metal layers being alternately formed one on another, (c) two pads formed on a common surface among upper and lower surfaces of the printed circuit board, (d) a resistor disposed on the common surface of the printed circuit board, and (e) a capacitor formed on the common surface of the printed circuit board, the ground layer and the power-supplying layer being in electrical communication with each of the pads through via-holes at a marginal end of the printed circuit board, the resistor and the capacitor being electrically connected in series with each other between the pads.

It is preferable that one of the ground layer and the power-supplying layer, located above the other, is formed with an electrically insulating region so that one of the via-holes electrically connecting the other of the ground layer and the power-supplying layer to one of the pads makes no electrical communication with the one of the ground layer and the power-supplying layer.

The printed circuit board may further include a third pad disposed between the resistor and the capacitor for electrically connecting the resistor and the capacitor in series with each other.

There is further provided a printed circuit board including (a) at least one dielectric layer, (b) at least two metal layers one of which acts as a ground layer, another one of which acts as a power-supplying layer, and the others of which, if any, act as a wiring layer in which a signal pattern is formed, the dielectric layer and the metal layers being alternately formed one on another, the power-supplying layer comprising a plurality of sections, (c) two pads formed on a common surface among upper and lower surfaces of the printed circuit board for each of the sections of the power-supplying layer, (d) a resistor disposed on the common surface of the printed circuit board for each of the sections of the power-supplying layer, and (e) a capacitor formed on the common surface of the printed circuit board for each of the sections of the power-supplying layer, the ground layer and the power-supplying layer being in electrical communication with each of the pads through via-holes at a marginal end of each of the sections, the resistor and the capacitor being electrically connected in series with each other between the pads.

There is further provided a printed circuit board including (a) at least one dielectric layer, (b) at least two metal layers one of which acts as a ground layer, another one of which acts as a power-supplying layer, and the others of which, if any, act as a wiring layer in which a signal pattern is formed, the dielectric layer and the metal layers being alternately formed one on another, (c) a plurality of pad-pairs formed on a common surface among upper and lower surfaces of the printed circuit board at a marginal end thereof, adjacent pad-pairs being spaced away from each other by a distance W defined as a half or smaller of a wavelength associated with an upper limit frequency within a frequency band to be suppressed, (d) resistors disposed on the common surface of the printed circuit board;, and (e) capacitors formed on the common surface of the printed circuit board, each of the ground layer and the power-supplying layer being in electrical communication with a pad in each of the pad-pairs through a via-hole at a marginal end of the printed circuit board, each of the resistors and each of the capacitors being electrically connected in series with each other between pads in each of the pad-pairs.

There is further provided a printed circuit board including (a) at least one dielectric layer, (b) at least two metal layers one of which acts as a ground layer, another one of which acts as a power-supplying layer, and the others of which, if any, act as a wiring layer in which a signal pattern is formed, the dielectric layer and the metal layers being alternately formed one on another, the power-supplying layer comprising a plurality of sections, (c) a plurality of pad-pairs formed on a common surface among upper and lower surfaces of the printed circuit board for each of the sections of the power-supplying layer, adjacent pad-pairs being spaced away from each other by a distance W defined as a half or smaller of a wavelength associated with an upper limit frequency within a frequency band to be suppressed, (d) resistors disposed on the common surface of the printed circuit board for each of the sections of the power-supplying layer, and (e) capacitors formed on the common surface of the printed circuit board for each of the sections of the power-supplying layer, each of the ground layer and the power-supplying layer being in electrical communication with a pad in each of the pad-pairs through a via-hole at a marginal end of each of the sections, each of the resistors and each of the capacitors being electrically connected in series with each other between pads in each of the pad-pairs.

There is further provided a printed circuit board including (a) at least one dielectric layer, (b) at least two metal layers one of which acts as a ground layer, another one of which acts as a power-supplying layer, and the others of which, if any, act as a wiring layer in which a signal pattern is formed, the dielectric layer and the metal layers being alternately formed one on another, and (c) a magnetic layer formed in the dielectric layer sandwiched between the ground layer and the power-supplying layer, the magnetic layer including a magnetic loss and having a center located at about a distance S measured from an edge of the printed circuit board in a lengthwise direction of the printed circuit board, the distance S being defined as one-fourth of a wavelength associated with a frequency to be depressed.

The printed circuit board may include a plurality of dielectric layers between the ground layer and the power-supplying layer, in which case, the magnetic layer is formed in all of the dielectric layers.

The printed circuit board may include a magnetic film in place of the magnetic layer, in which case, the magnetic film is formed as a part of the wiring layer, has a magnetic loss, and has a center located at about a distance S measured from an edge of the printed circuit board in a lengthwise direction of the printed circuit board, the distance S being defined as one-fourth of a wavelength associated with a frequency to be depressed.

It is preferable that the magnetic layer is formed in parallel with both the ground layer and the power-supplying layer.

There is further provided a printed circuit board including (a) at least one dielectric layer, (b) at least two metal layers one of which acts as a ground layer, another one of which acts as a power-supplying layer, and the others of which, if any, act as a wiring layer in which a signal pattern is formed, the dielectric layer and the metal layers being alternately formed one on another, and (c) a magnetic layer formed in the dielectric layer sandwiched between the ground layer and the power-supplying layer, the magnetic layer including a magnetic loss and occupying an area having an outer boundary spaced away from an edge of the printed circuit board by a distance S, the distance S being defined as one-fourth of a wavelength associated with a frequency to be depressed.

There is further provided a printed circuit board including (a) at least one dielectric layer, (b) at least two metal layers one of which acts as a ground layer, another one of which acts as a power-supplying layer, and the others of which, if any, act as a wiring layer in which a signal pattern is formed, the dielectric layer and the metal layers being alternately formed one on another, and (c) a magnetic layer formed between the ground layer and the power-supplying layer, the magnetic layer including a magnetic loss and coextending with the printed circuit board.

There is further provided a printed circuit board including (a) at least one dielectric layer, (b) at least two metal layers one of which acts as a ground layer, another one of which acts as a power-supplying layer, and the others of which, if any, act as a wiring layer in which a signal pattern is formed, the dielectric layer and the metal layers being alternately formed one on another, and (c) an electrically insulating layer formed between the ground layer and the power-supplying layer, the electrically insulating layer including a magnetic loss.

It is preferable that the electrically insulating layer has a center thereof in a lengthwise direction of the printed circuit board, located at about a distance S measured from an edge of the printed circuit board in a lengthwise direction of the printed circuit board, the distance S being defined as one-fourth of a wavelength associated with a frequency to be depressed. The electrically insulating layer may occupy an area having an outer boundary spaced away from an edge of the printed circuit board by a distance S, the distance S being defined as one-fourth of a wavelength associated with a frequency to be depressed.

As mentioned earlier, resonance caused by standing waves generated between a ground layer and a power-supplying layer is a major factor in a multi-layered printed circuit board for unintentional electromagnetic interference and malfunction caused by intrusion of external electromagnetic field thereinto. In accordance with the above-mentioned multi-layered printed circuit board, an electric loss is arranged at a marginal end of a substrate at which an electric field has a maximum intensity between a ground layer and a power-supplying layer, to thereby prevent resonance. As a result, it is possible to prevent unintentional electromagnetic interference and malfunction of a circuit caused by intrusion of external electromagnetic field thereinto.

In addition, in accordance with the multi-layered printed circuit board, a magnetic loss is arranged at a distance of a quarter of a wavelength from an outer edge of a substrate, where a magnetic field has a maximum intensity between a ground layer and a power-supplying layer, to thereby prevent resonance. Thus, it is possible to prevent unintentional electromagnetic interference and malfunction of a circuit caused by intrusion of external electromagnetic field thereinto.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figure 1:
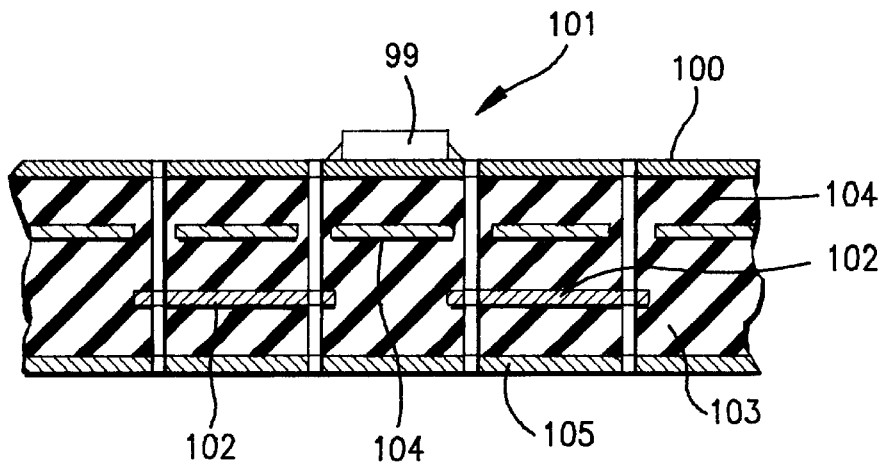
FIG. 1 is a cross-sectional view of the first conventional multi-layered printed circuit board.
Figure 2:
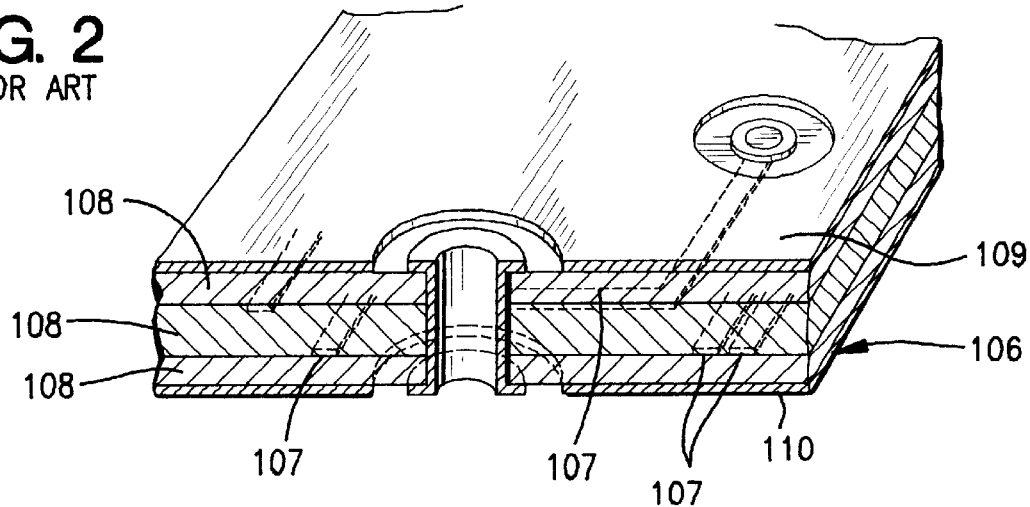
FIG. 2 is a perspective view of the second conventional multi-layered printed circuit board.
Figure 3:
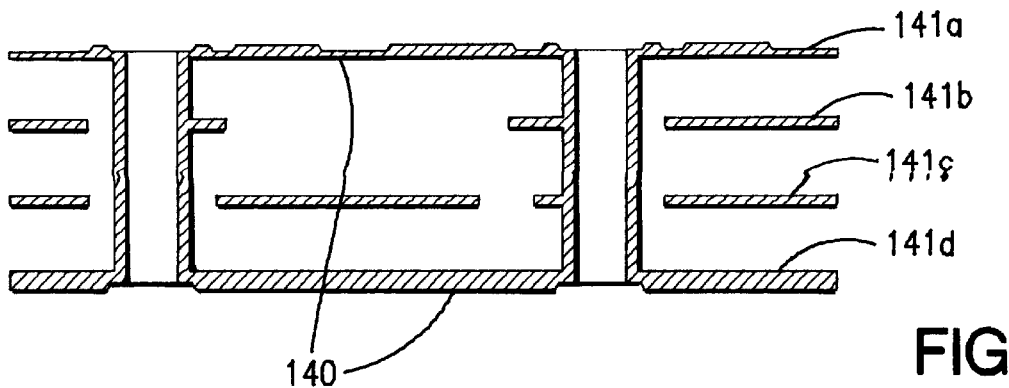
FIG. 3 is a cross-sectional view of the third conventional multi-layered printed circuit board.
Figure 4:
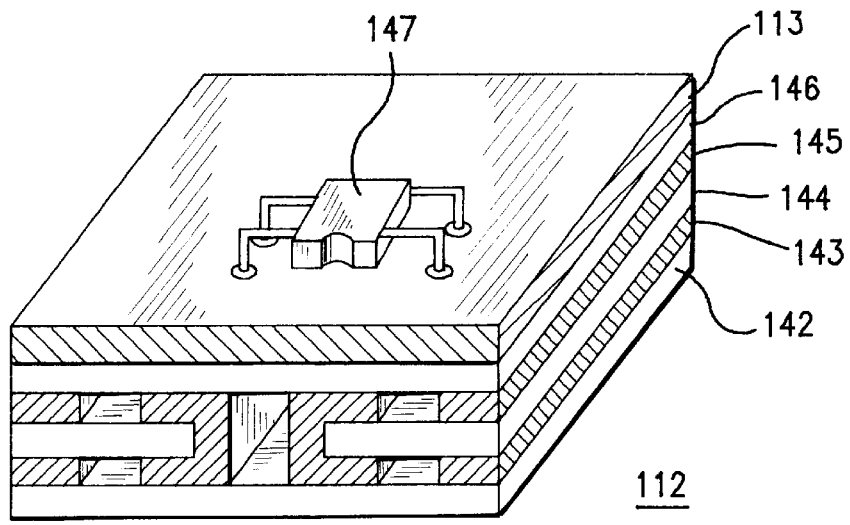
FIG. 4 is a perspective view of the fourth conventional multi-layered printed circuit board.
Figure 5:
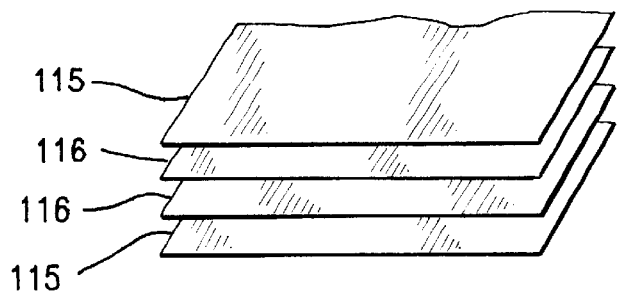
FIG. 5 is a schematic view of the fifth conventional multi-layered printed circuit board.
Figure 6:
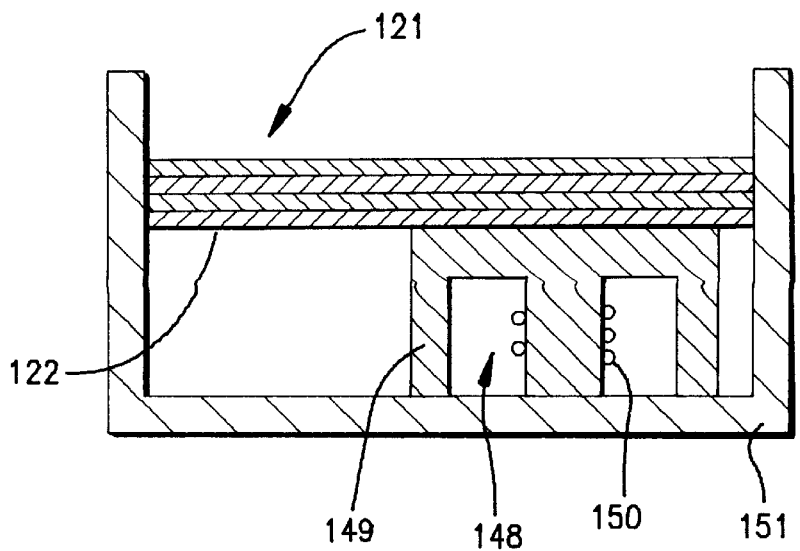
FIG. 6 is a cross-sectional view of the sixth conventional multi-layered printed circuit board.
Figure 7:
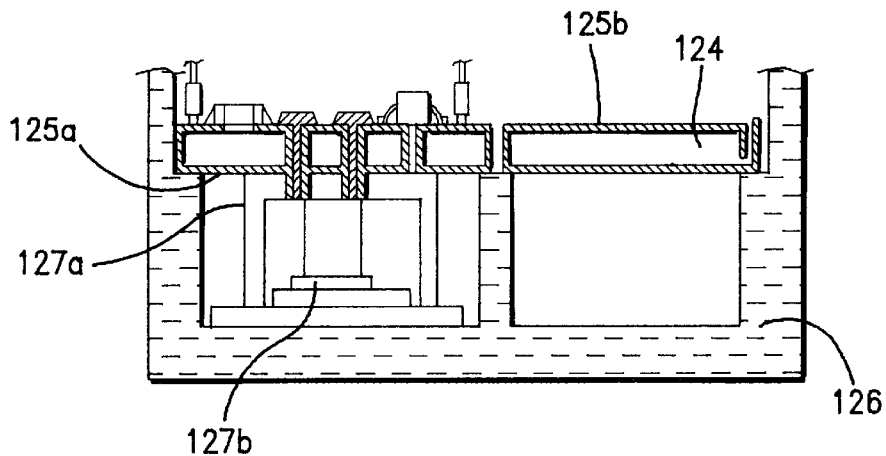
FIG. 7 is a cross-sectional view of the seventh conventional multi-layered printed circuit board.
Figure 8:
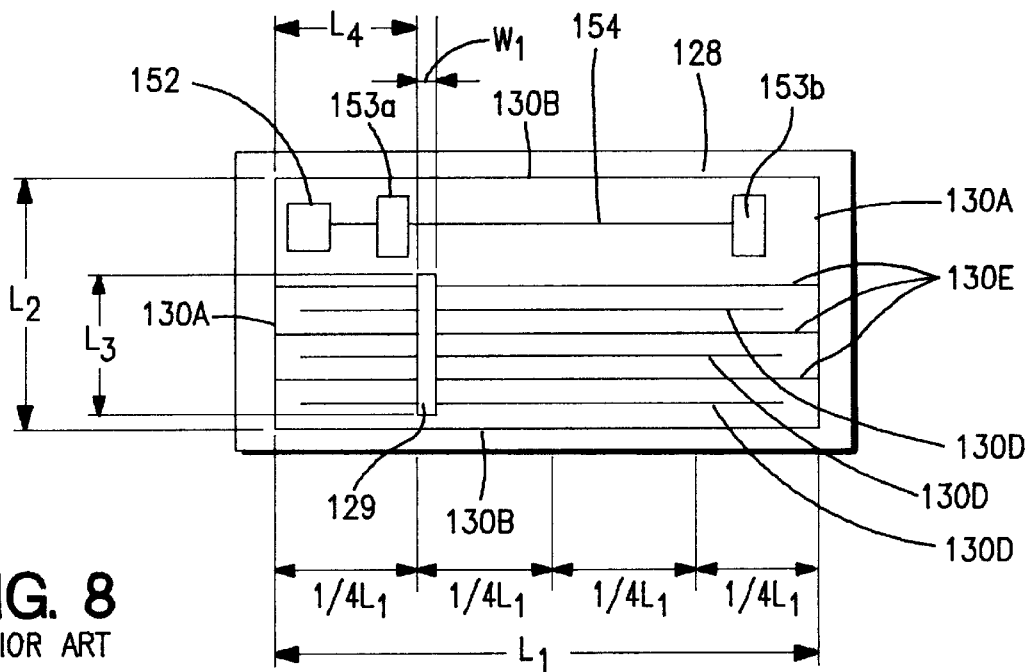
FIG. 8 is a top plan view of the eighth conventional multi-layered printed circuit board.
Figure 9:
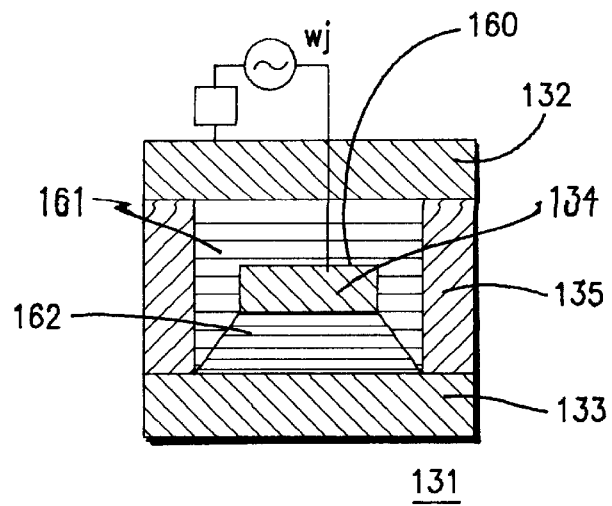
FIG. 9 is a cross-sectional view of the ninth conventional multi-layered printed circuit board.
Figure 10:
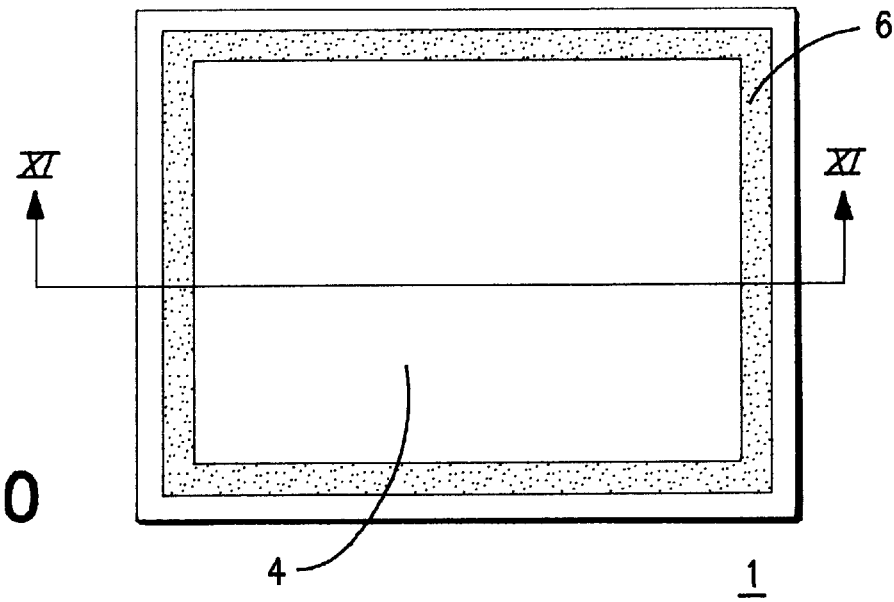
FIG. 10 is a plan view illustrating a multi-layered printed circuit board in accordance with the first embodiment of the present invention.

The first embodiment in accordance with the present invention is explained hereinbelow with reference to FIGS. 10 and 11.

Figure 11:
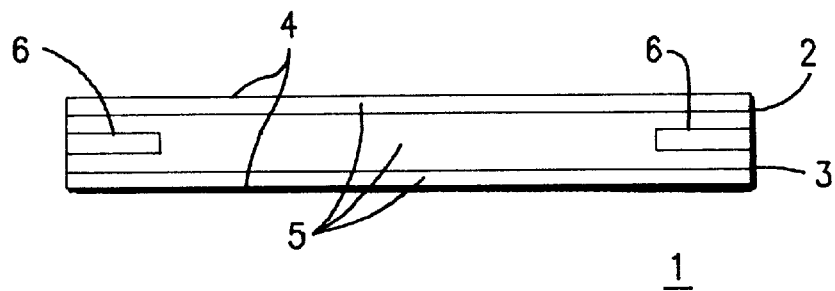
FIG. 11 is a cross-sectional view taken along the line XI—XI in FIG. 10.

As illustrated in FIG. 11, a printed circuit board 1 in accordance with the first embodiment includes four metal layers 2, 3, 4, 4 and three dielectric layers 5. The metal layers 2, 3, 4, 4 and dielectric layers 5 are alternately deposited one on another. Specifically, each of the dielectric layers 5 is sandwiched between the metal layers 2, 3, 4, 4. In FIG. 11, the metal layers 2, 3, 4, 4 are so thin that they are represented as solid lines. The metal layers 2, 3, 4, 4 are formed by field plating so as to form a circuit pattern. The dielectric layers 5 are made of insulating material such as glass epoxy and paper phenol.

Now that the metal layers are called first, second, third and fourth layers from the top, the first and fourth metal layers act as a wiring layer 4 in which a signal pattern is formed, and the second and third layers act as a ground layer 2 and a power-supplying layer 3, respectively.

A resistor 6 made of resistive material is formed at a marginal end of the printed circuit board 1 in the dielectric layer 5 sandwiched between the ground layer 2 and the power-supplying layer 3. The resistor 6 is designed to have a thickness smaller than the dielectric layer 5 and be disposed intermediate between the thickness of the dielectric layer 5 so that the resistor 6 does not make direct contact with both the ground layer 2 and the power-supplying layer 3. That is, the resistor 6 has a function of disallowing current communication between the ground layer 2 and the power-supplying layer 3.

In the first embodiment, the resistor 6 is designed to make no electrical communication with both the ground layer 2 and the power-supplying layer 3. However, it should be noted that the resistor 6 may be designed to make electrical communication with only one of the ground layer 2 and the power-supplying layer 3. It is necessary for the ground layer 2 and the power-supplying layer 3 to be open therebetween in terms of direct current, and hence, the resistor 6 is not allowed to make electrical communication with both the ground layer 2 and the power-supplying layer 3.

Figure 12:
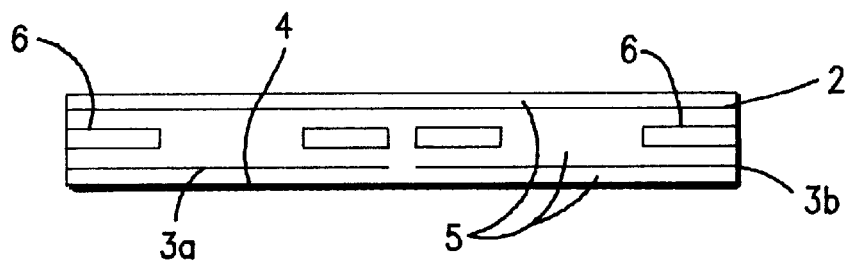
FIG. 12 is a cross-sectional view taken along the line XI—XI in FIG. 10, of a multi-layered circuit board having a power-supplying layer divided into a plurality of sections.

FIG. 12 illustrates a variation of the first embodiment where the power supplying layer 3 is divided into a plurality of sections 3a to 3n (FIG. 12 illustrates only the sections 3a and 3b). In this variation, the resistor 6 is disposed at marginal ends of each of the sections 3a and 3b of the power-supplying layer 3.

The resistor 6 is made of material having electrical loss, such as carbon and graphite, or polymer resin, such as epoxy resin, containing the above-mentioned material dispersed therein in the form of powder or filler.

Figure 13:
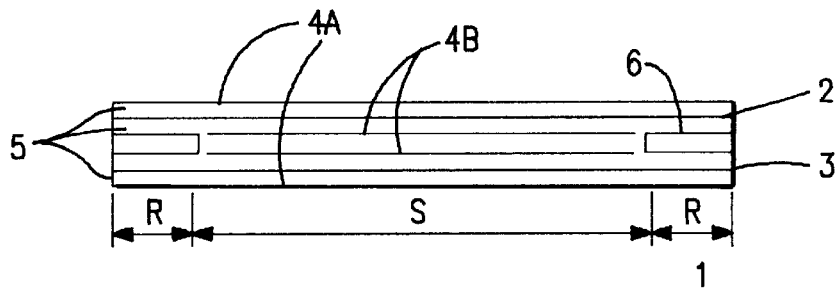
FIG. 13 is a cross-sectional view taken along the line XI—XI in FIG. 10, of a multi-layered circuit board having six metal layers.

Though the printed circuit board in accordance with the first embodiment has the four metal layers, the first embodiment may be applied to a multi-layered printed circuit board having the greater number of metal layers, such as six and eight metal layers. For instance, FIG. 13 illustrates a printed circuit board where first and sixth metal layers are formed as a wiring layer 4A having a signal pattern, third and fourth layers are formed as a wiring layer 4B having a signal pattern, a second layer is formed as a ground layer 2, and a fifth layer is formed as a power-supplying layer 3. In the illustrated printed circuit board, a signal wiring pattern of the wiring layers 4B sandwiched between the ground layer 2 and the power-supplying layer 3 is formed in a limited area S located at a certain distance from an edge of the printed circuit board, and the resistors 6 are disposed in areas R located between the area S and an edge of the printed circuit board. Thus, even if a printed circuit board had four or more metal layers, the printed circuit board could have the same structure as that of the printed circuit board 1 illustrated in FIG. 11.

The reason why the above-mentioned first embodiment can prevent occurrence of EMI and circuit malfunction caused by intrusion of external electromagnetic field thereinto is explained hereinbelow with reference to the experiments the inventors had conducted.

Figure 14:
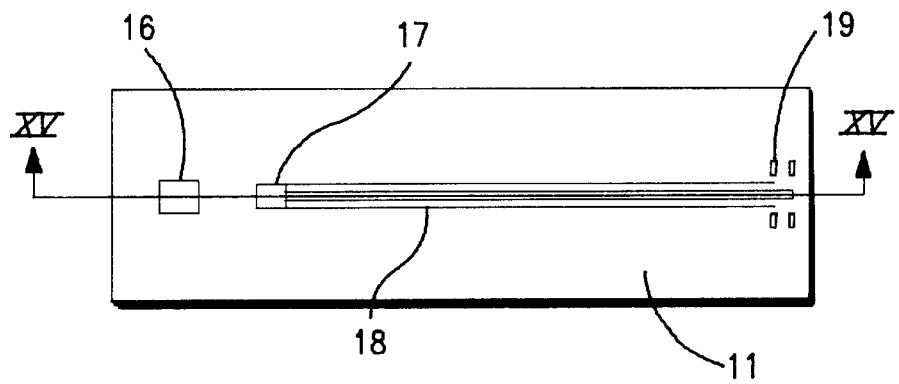
FIG. 14 is a top plan view illustrating a printed circuit board having been used in the experiment carried out for explaining the principle of the first embodiment in accordance with the present invention.
Figure 15:
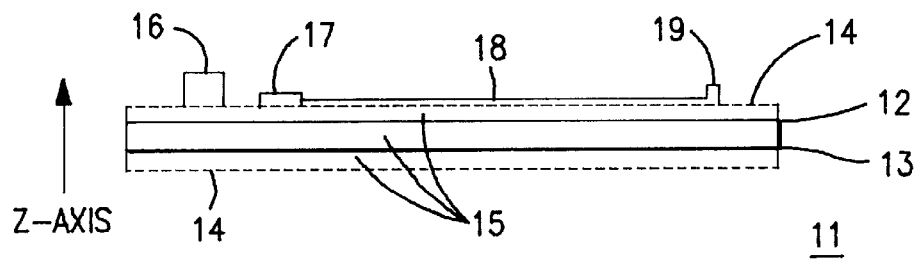
FIG. 15 is a cross-sectional view taken along the line XV—XV in FIG. 14.

FIG. 14 illustrates the printed circuit board 11 having been used for the experiments for explaining the principle of the present invention, and FIG. 15 is a cross-sectional view of the printed circuit board 11 taken along the line XV—XV in FIG. 14.

The illustrated printed circuit board 11 has four metal layers 12, 13, 14, 14 and three dielectric layers 15. Those layers 12, 13, 14, 14 are deposited one on another. The first and fourth metal layers are signal wiring layers 14, the second metal layer is a ground layer 12, and the third metal layer 13 is a power-supplying layer.

The printed circuit board 11 has an area of 160 mm×24 mm and a thickness of 1.6 mm. Each of the metal layers 12, 13, 14 is formed of a copper foil having a thickness in the range of 25 $\mu$m to 40 $\mu$m. Each of the metal layers 12 to 14 is physically and electrically separated from an adjacent metal layer by a dielectric glass epoxy layer 15. The dielectric glass epoxy layer 15 is designed to have a thickness of about 0.25 mm between the first and second layers and between the third and fourth layers, and a thickness of about 1 mm between the second and third layers. The ground layer 12 and the power-supplying layer 13 have a solid wiring pattern, that is, a wiring pattern entirely covering the layers 12 and 13 therewith.

On the printed circuit board 11 is centrally formed a circuit comprising a crystal oscillator 16, an integrated circuit (IC) 17, four signal wiring patterns 18 extending from the integrated circuit 17, and a terminating resistor 19 terminating the signal wiring patterns 18. The crystal oscillator 16 has an oscillation frequency of 20 MHz. The integrated circuit 17 is comprised of TTL invertor 74AS04. The signal wiring patterns 18 are about 105 mm long, and are terminated with the resistor 19 of 75 ohms. The signal wiring patterns 18 are formed only on the first metal layer, and no signal wiring patterns are formed on the fourth metal layer except a wiring for transferring signals emitted from the crystal oscillator 16 for driving IC 17.

The circuit having the above-mentioned structure was driven with a direct current at 5 V, and EMI was measured at a distance of 10 m from the printed circuit board 11. The result was that EMI having an electric field intensity of 46 dB $\mu$V/m was measured at a frequency band centered around 220 MHz.

Figure 16:
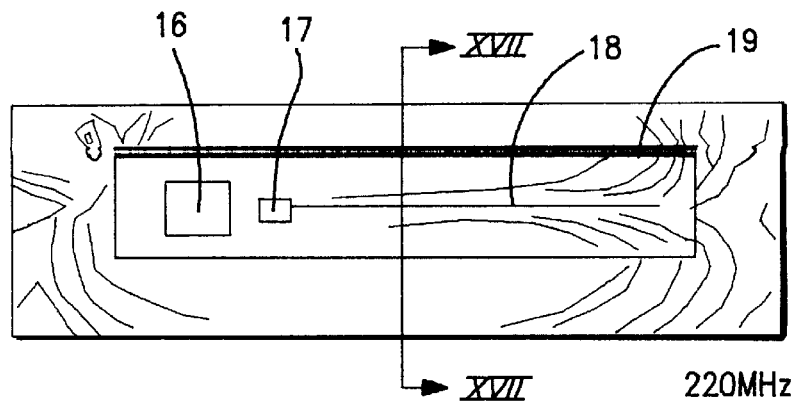
FIG. 16 illustrates a profile of the magnetic field intensity in the printed circuit board illustrated in FIG. 14.

Then, a profile of a magnetic intensity in the vicinity of the printed circuit board 11 was measured when the circuit was driven at a frequency of 220 MHz. FIG. 16 illustrates a component Hz of the measured intensity of a magnetic field in a Z-axis direction perpendicular to the printed circuit board 11. A magnetic field intensity is greater in a darker colored area, and is smaller in a thinner colored area. In view of a magnetic field intensity profile in a direction of shorter sides of the printed circuit board 11, the magnetic field intensity is great in particular at opposite ends, namely at longer sides of the printed circuit board 11. The reason is considered as follows.

Figure 17:
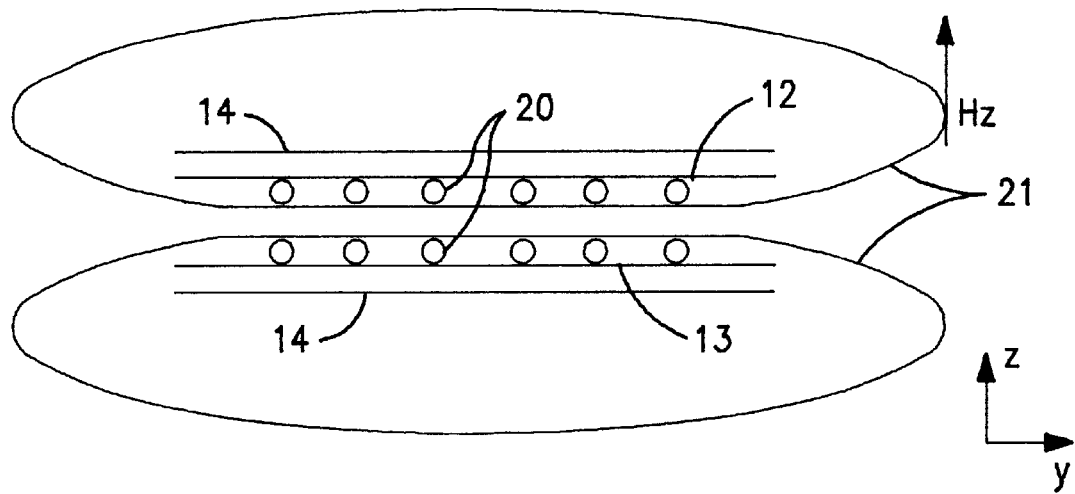
FIG. 17 is a cross-sectional view taken along the line XVII—XVII in FIG. 16, illustrating current and lines of magnetic force in the printed circuit board illustrated in FIG. 14.

FIG. 17 is a cross-sectional view taken along the line XVII—XVII in FIG. 16, illustrating both current 20 running through the ground layer 12 and the power-supplying layer 13 and lines 21 of magnetic force. The current 20 flows in a direction perpendicular to the cross-section in a parallel plate path formed between the ground and power-supplying layers 12 and 13. As a result, the lines 21 of magnetic force are produced in parallel with the cross-section of the printed circuit board 11. The profile of the magnetic field intensity illustrated in FIG. 16 is a profile obtained by measuring the lines 21 of magnetic force leaked out of the printed circuit board 11, and shows a magnetic field profile to be observed when electromagnetic waves transfer through the parallel plate path formed between the ground and power-supplying layers 12 and 13.

On the other hand, viewing the profile in a direction of longer sides of the printed circuit board 11, the magnetic field intensity is in maximum in the vicinity of IC 17, and in minimum at opposite ends of the printed circuit board 11. The reason is considered as follows.

Figure 18:
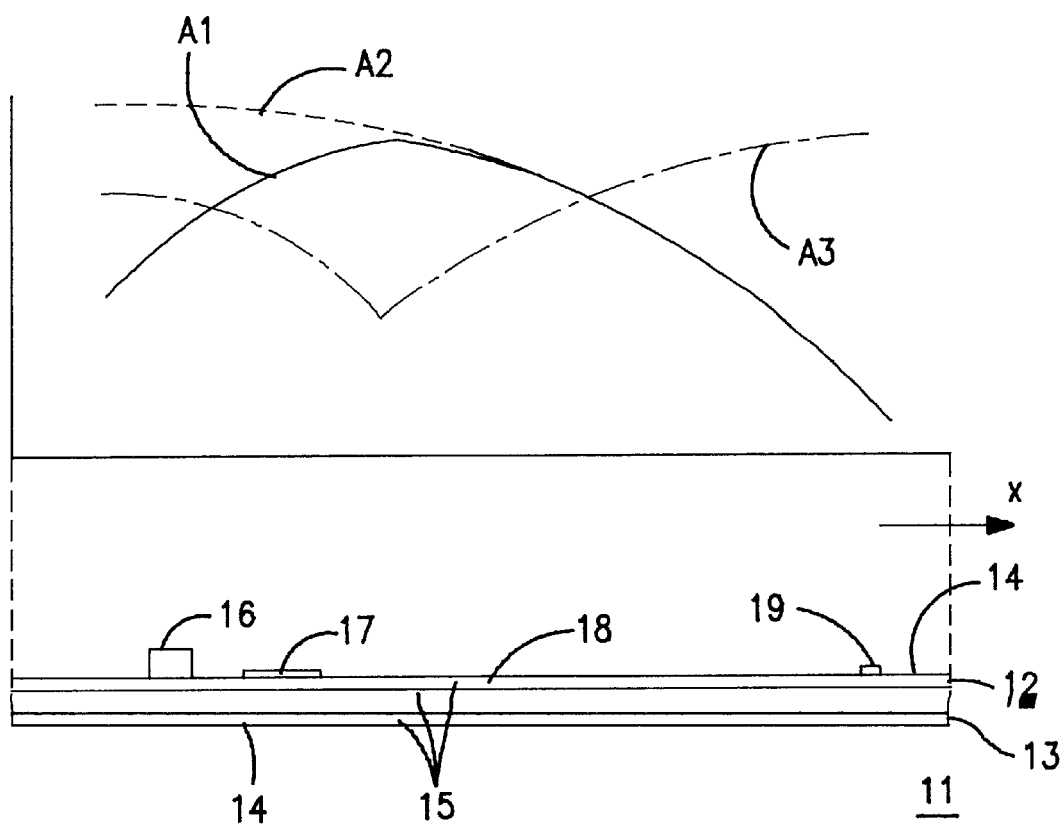
FIG. 18 illustrates profiles of both magnetic field intensity and electric field intensity along a marginal end of the printed circuit board illustrated in FIG. 14.

In FIG. 18, a solid line A1 shows variation in a magnetic field intensity along an edge of a longer side of the printed circuit board 11. The magnetic field intensity is almost zero at opposite ends in the longer side direction, and becomes higher towards the center of the printed circuit board 11.

A broken line A2 in FIG. 18 is a sine wave curve in which wavelength shortening occurring when a signal of 220 MHz is transferred through the dielectric layers 15 is taken into consideration. The broken line A2, which is equal to zero at the right-side end, is almost consistent with the solid line A1 until a point where IC 17 is mounted. This means that there exists a current standing wave having the opposite end of the printed circuit board 11 as an open end, which in turn means that resonance takes place at the same frequency in the parallel plate path formed between the ground and power-supplying layers 12 and 13. The thus generated resonance is a cause of unintentional electromagnetic interference. The resonance frequency is inherent in dependence on a size of the printed circuit board 11 and the circuit mounted on the printed circuit board 11. Great fluctuation in a voltage tends to occur at the resonance frequency even by an electromagnetic field intruding into the printed circuit board 11, resulting in malfunction of the circuit.

Accordingly, in order to prevent EMI and malfunction of the circuit both caused by fluctuation in a voltage between the ground layer 12 and the power-supplying layer 13, it is helpful to dispose material having an electrical loss in the parallel plate path formed between the ground and power-supplying layers 12 and 13, to thereby absorb resonant energy generated in the path into the electrical loss.

The magnetic field intensity of the printed circuit board 11 illustrated in FIGS. 15 and 16 significantly reduces at opposite ends in a direction of shorter sides of the printed circuit board 11 to thereby establish open ends. As illustrated in FIG. 18, the magnetic field intensity represented with the solid line A1 is zero at the open end, whereas an electric field intensity represented with a dashed line A3 is maximum at the open end.

In accordance with the above-mentioned first embodiment, material having an electric loss, such as the resistor 6, is inserted into the printed circuit board 11 at marginal ends thereof where an electric field is in maximum. This ensures depression of resonance, resulting in that EMI caused by the resonance is reduced, and that fluctuation in a voltage which causes malfunction of a circuit is also reduced.

In general, a printed circuit board is approximately square. Current two-dimensionally flows in ground and power-supplying layers, namely, current flows in X- and Y-axes directions. Accordingly, four sides are all open ends, when current flows in a square printed circuit board. Hence, as illustrated in FIG. 10, the resistor 6 may be formed along four sides of the printed circuit board 1 for preventing EMI and fluctuation in a power source voltage.

Second Embodiment

Figure 19:
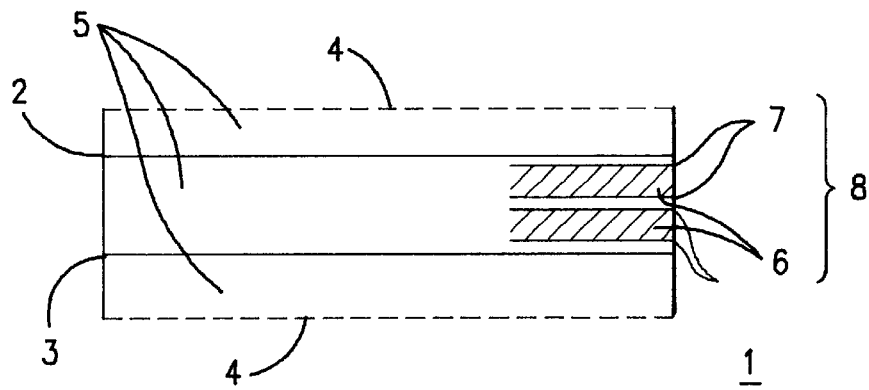
FIG. 19 is a cross-sectional view of a multi-layered printed circuit board in accordance with the second embodiment of the present invention.

A printed circuit board in accordance with the second embodiment is almost the same as the first embodiment, but is different only in that a multi-layered structure 8 is disposed at a marginal end of the printed circuit board 1 between the ground power-supplying layers 2 and 3, as illustrated in FIG. 19. The multi-layered structure 8 is comprised of compound layers and dielectric layers both of which are alternately deposited, where the compound layer is comprised of the resistor 6 and metal layers 7 sandwiching the resistor 6 therebetween in parallel with the ground and power-supplying layers 2 and 3.

In the printed circuit board 1 illustrated in FIG. 19, since the dielectric layers 5 formed between the ground layer 2 and the metal layer 7, between the etal layers 7, and between the power-supplying layer 3 and the metal layer 7 cannot avoid to be thin, a capacitor equivalently established by those metal layers 7 and dielectric layers 5 has a great capacity, which ensures that an electric field is concentrated at the marginal end of the printed circuit board 1 to thereby enhance effects of electric loss of the resistor 6. FIG. 19 illustrates an example in which a plurality of the compound layers are formed, however, there may be formed only one compound layer.

Third Embodiment

Figure 20:
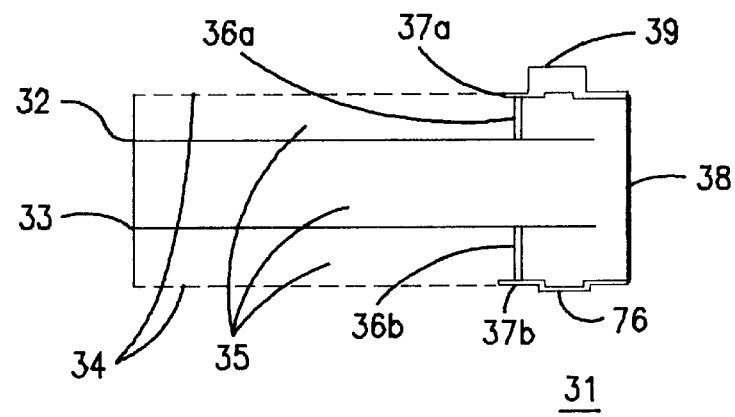
FIG. 20 is a cross-sectional view of a multi-layered printed circuit board in accordance with the third embodiment of the present invention.

FIG. 20 is a cross-sectional view of a multi-layered printed circuit board 31 in accordance with the third embodiment. The printed circuit board 31 includes four metal layers 32, 33, 34, 34 and three dielectric layers 35. The metal layers 32, 33, 34, 34 and dielectric layers 35 are alternately deposited one on another. Specifically, each of the dielectric layers 35 is sandwiched between the metal layers 32, 33, 34, 34. The metal layers 32, 33, 34, 34 are formed by field plating so as to form a circuit pattern. The dielectric layers 35 are made of insulating material such as glass epoxy and paper phenol. The first and fourth metal layers act as a wiring layer 34 in which a signal pattern is formed, and the second and third layers act as a ground layer 32 and a power-supplying layer 33, respectively.

Pads 37a and 37b are formed on upper and lower surfaces of the printed circuit board 31. A device is to be mounted on the pads 37a and 37b. The ground layer 32 and the power-supplying layer 33 are in electrical communication with each of the pads 32a and 32b through via-holes 36a and 36b at a marginal end of the printed circuit board 31. A capacitor 39 is mounted adjacent to the pad 37a on the upper surface of the printed circuit board 31.

The printed circuit board 31 is formed with a resistive film 38 extending from an upper surface to a lower surface through a sidewall of the printed circuit board 31. The resistive film 38 is in electrical communication with the pad 37a through the capacitor 39, and is in direct electrical communication with the pad 37b. As an alternative, as illustrated in FIG. 20, there may be mounted a short-circuit plate 76 adjacent to the pad 37b on the lower surface of the printed circuit board 31, and the resistive film 38 may be designed to make electrical communication with the pad 37b through the short-circuit plate 76. Alternatively, there may be mounted an additional capacitor (not illustrated) on the lower surface of the printed circuit board 31 in place of the short-circuit plate 76, and the resistive film 38 may be designed to make electrical communication with the pad 37b through the additional capacitor.

In a digital circuit, a constant dc voltage such as 5 V and 3.3 V has to be applied across the ground layer 32 and the power-supplying layer 33. To this end, the ground layer 32 and the power-supplying layer 33 have to be electrically isolated from each other. If the resistive film 38 simultaneously makes direct, electrical contact with both the ground layer 32 and the power-supplying layer 33, there is caused a problem that a dc current flows between them. Accordingly, it is necessary to put a capacitor between the resistive film 38 and the ground and the power-supplying layers 32, 33 so that the resistive film 38 does not make simultaneous contact with the ground layer 32 and the power-supplying layer 33.

The resistive film 38 is made of material having electric loss, such as carbon and graphite, or of a sheet such as cloth on which material having electric loss is applied.

It is preferable that the capacitor 39 has a parasitic inductance small enough to prevent reduction in current running through the resistive film 38, caused by an increase in impedance in high frequency band. For instance, a chip capacitor is preferably used as the capacitor 39.

The third embodiment may be applied to a printed circuit board including the greater number of metal layers than four. Namely, the same structure as the structure illustrated in FIG. 20 may be obtained by designing the ground layer 32 and the power-supplying layer 33 to make electrical communication with the pads 37a and 37b through the via-holes 36a and 36b at a marginal end of the printed circuit board 31, even if the printed circuit board 31 includes six, eight or greater metal layers.

The reason why the printed circuit board 31 in accordance with the third embodiment can prevent occurrence of EMI and malfunction of a circuit caused by intrusion of external electromagnetic field thereinto is the same as the reason having been explained in the first embodiment. That is, the resonance generated in the parallel plate path formed between the ground layer 32 and the power-supplying layer 33 is attenuated by means of the resistive film 38 having electric loss and disposed at a marginal end of the printed circuit board 31 where the intensity of electric field represented with the dashed line A3 in FIG. 18 is maximum, resulting in reduction in EMI caused by the resonance and further reduction in fluctuation in a voltage which causes malfunction of a circuit.

As illustrated in FIG. 20, since the ground layer 32 and the power-supplying layer 33 make direct communication with each other through the capacitor 39 and the resistive film 38, high frequency current flows directly through the resistive film 38, resulting in enhancement in effect brought by electric loss of the resistive film 38.

Fourth Embodiment

Figure 21:
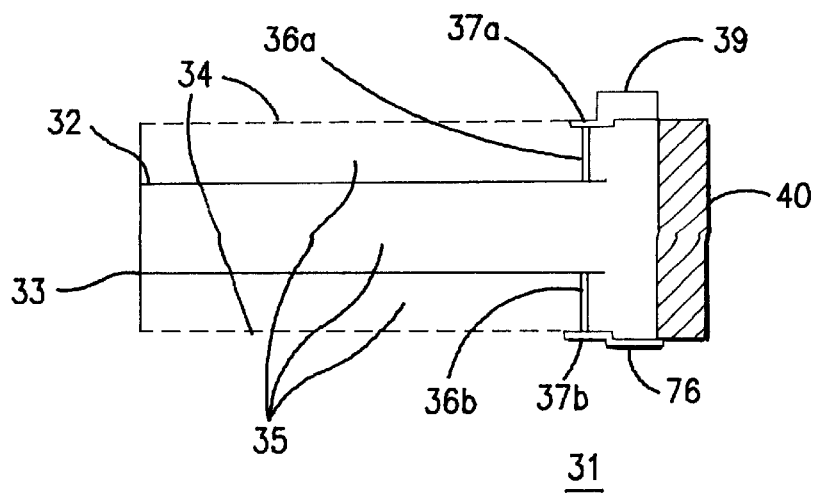
FIG. 21 is a cross-sectional view of a multi-layered printed circuit board in accordance with the fourth embodiment of the present invention.

The fourth embodiment is almost the same as the third embodiment except that a resistor 40 is formed on a sidewall of the printed circuit board 31 in place of the resistive film 38, as illustrated in FIG. 21. Similarly to the resistive film 38 in the third embodiment, the resistor 40 is designed to make electrical communication with the pad 37a through the capacitor 39, and make electrical communication directly with the pad 37b or through the short-circuit board 76. The ground layer 32 and the power-supplying layer 33 make electrical communication with the pads 37a and 37b through the via-holes 36a and 36b, respectively.

As illustrated in FIG. 21, since the ground layer 32 and the power-supplying layer 33 make direct communication with each other through the capacitor 39 and the resistor 40, high frequency current flows directly through the resistor 40, resulting in enhancement in effect brought by electric loss of the resistor 40.

Fifth Embodiment

Figure 22:
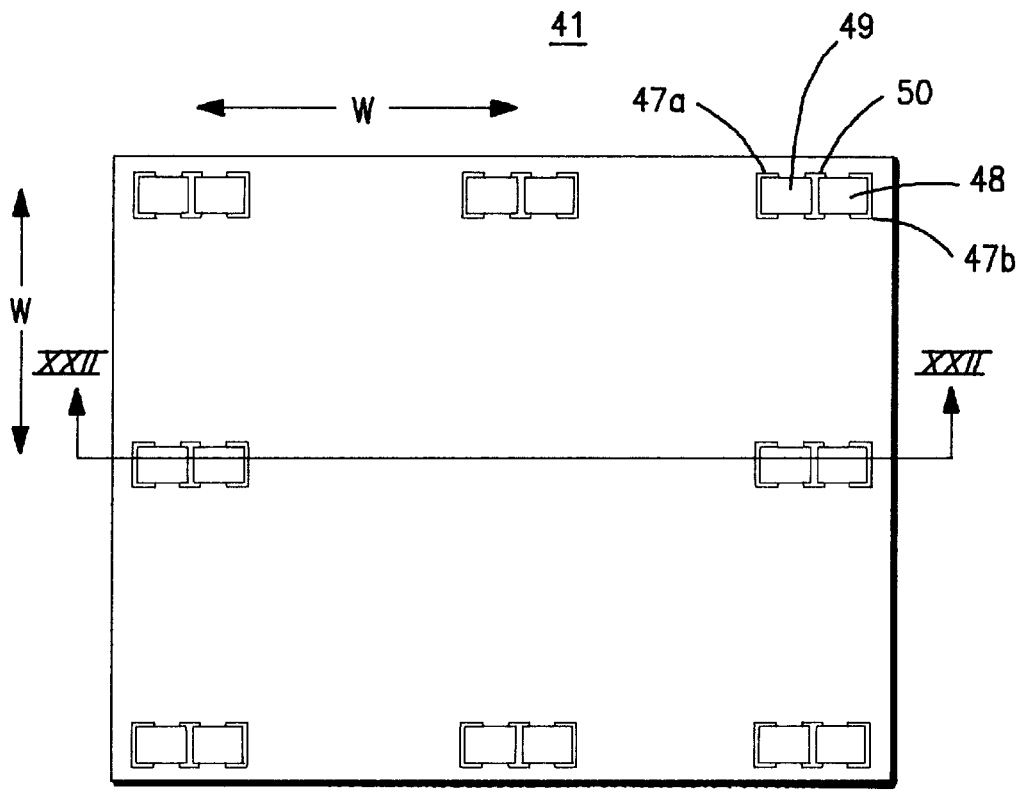
FIG. 22 is a top plan view illustrating a multi-layered printed circuit board in accordance with the fifth embodiment of the present invention.
Figure 23:
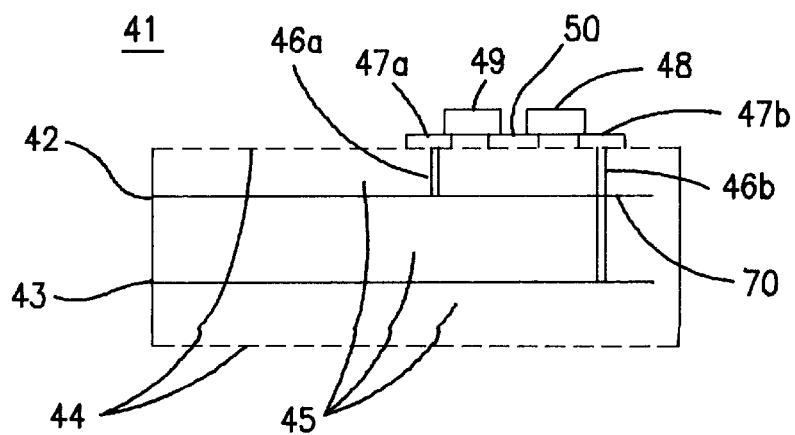
FIG. 23 is a cross-sectional view taken along the line XXIII—XXIII in FIG. 22.

FIGS. 22 and 23 illustrate a printed circuit board 41 in accordance with the fifth embodiment. The printed circuit board 41 includes four metal layers 42, 43, 44, 44 and three dielectric layers 45. The metal layers 42, 43, 44, 44 and dielectric layers 45 are alternately deposited one on another. Specifically, each of the dielectric layers 45 is sandwiched between the metal layers 42, 43, 44, 44. The metal layers 42, 43, 44, 44 are formed by field plating so as to form a circuit pattern. The dielectric layers 45 are made of insulating material such as glass epoxy and paper phenol. The first and fourth metal layers act as a wiring layer 44 in which a signal pattern is formed, and the second and third layers act as a ground layer 42 and a power-supplying layer 43, respectively.

Pads 47a, 47b and 50 are formed in series on an upper surface of the printed circuit board 41. A device is to be mounted on the pads 47a and 47b. A resistor 49 is disposed on an upper surface of the printed circuit board 41 between the pads 47a and 50, and a capacitor 48 is disposed on an upper surface of the printed circuit board 41 between the pads 50 and 47b. Thus, the capacitor 48 and the resistor 49 are electrically connected in series with each other between the pads 47a and 47b. The pad 50 is mounted on the upper surface of the printed circuit board 41 for arranging the capacitor 48 and the resistor 49 in series. The ground layer 42 and the power-supplying layer 43 are in electrical communication with the pads 47a and 47b through via-holes 46a and 46b at a marginal end of the printed circuit board 41.

As illustrated in FIG. 23, the via-hole 46b electrically connecting the power-supplying layer 43 to the pad 47b intersects with the ground layer 42 located above the power-supplying layer 43. Hence, the ground layer 42 is formed with an electrically insulating region 70 around an intersection with the via-hole 46b so as not to make electrical communication with the via-hole 46b.

As illustrated in FIG. 22, a plurality of arrangements including the pads 47a, 47b and 50, the capacitor 48 and the resistor 49 are disposed at marginal ends of the printed circuit board 41 so that the adjacent arrangements are spaced away from each other by a distance W. Herein, the distance W is defined as a half or smaller of a wavelength in the printed circuit board 41, associated with an upper limit frequency within a frequency band to be suppressed for preventing EMI and malfunction of a circuit.

For instance, if a target frequency band to be depressed were in the range of 30 MHz and 1000 MHz, and a dielectric layer were made of glass epoxy having a dielectric constant of about 5, a wavelength in the printed circuit board, associated with the maximum frequency, 1000 MHz, is 134 mm. Thus, the arrangements including the pads 47a, 47b and 50, the capacitor 48 and the resistor 49 are spaced away from each other by a distance of about 67 mm or smaller.

The reason why the printed circuit board 41 in accordance with the fifth embodiment can prevent occurrence of EMI and malfunction of a circuit caused by intrusion of external electromagnetic field thereinto is the same as the reason having been explained in the first embodiment. That is, the resonance generated in the parallel plate path formed between the ground layer 42 and the power-supplying layer 43 is attenuated by means of the resistor 48 having electric loss and disposed at a marginal end of the printed circuit board 41 where the intensity of electric field represented with the dashed line A3 in FIG. 18 is maximum, resulting in reduction in EMI caused by the resonance and further reduction in fluctuation in a voltage which causes malfunction of a circuit.

The reason why the resistor 48 is electrically connected in series with the capacitor 49 is to prevent a dc current from running between the ground layer 42 and the power-supplying layer 43.

The reason why the arrangements including the pads 47a, 47b and 50, the capacitor 48 and the resistor 49 are disposed at marginal ends of the printed circuit board 41 so that the adjacent arrangements are spaced away from each other by the distance W is as follows. If discontinuity were generated at a certain interval W in a transfer path such as a parallel plate path, resonance would occur at a frequency at which the distance W is equal to a half of an associated wavelength in the same way as a transfer path having short-circuited opposite ends, resulting in a possibility that EMI and circuit malfunction caused by intrusion of external electromagnetic field tend to readily occur. Accordingly, it is possible to prevent occurrence of resonance by designing the distance W to be equal to a half or smaller of a wavelength associated with a maximum frequency at which a wavelength is shortest within a target frequency band. In the abovementioned first embodiment, a frequency at which resonance occurs is set outside the target frequency band.

Sixth Embodiment

Figure 24:
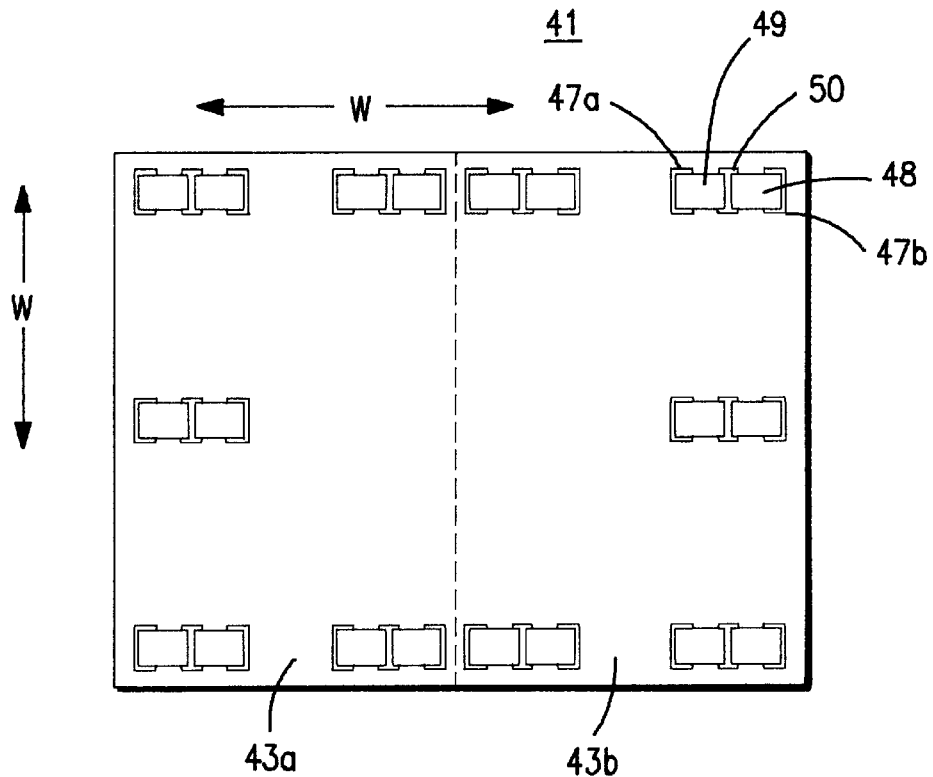
FIG. 24 is a top plan view illustrating a variation of the fifth embodiment, wherein a power-supplying layer is divided into a plurality of sections.

The sixth embodiment is almost the same as the fifth embodiment, but is different from the fifth embodiment only in that the power-supplying layer 43 is divided into two sections 43a and 43b, as illustrated in FIG. 24. In the sixth embodiment, the arrangements including the pads 47a, 47b and 50, the capacitor 48 and the resistor 49 are formed on each of the sections 43a and 43b at marginal ends so that the arrangements are spaced away from each other in each of the sections 43a and 43b by the distance W.

Seventh Embodiment

Figure 25:
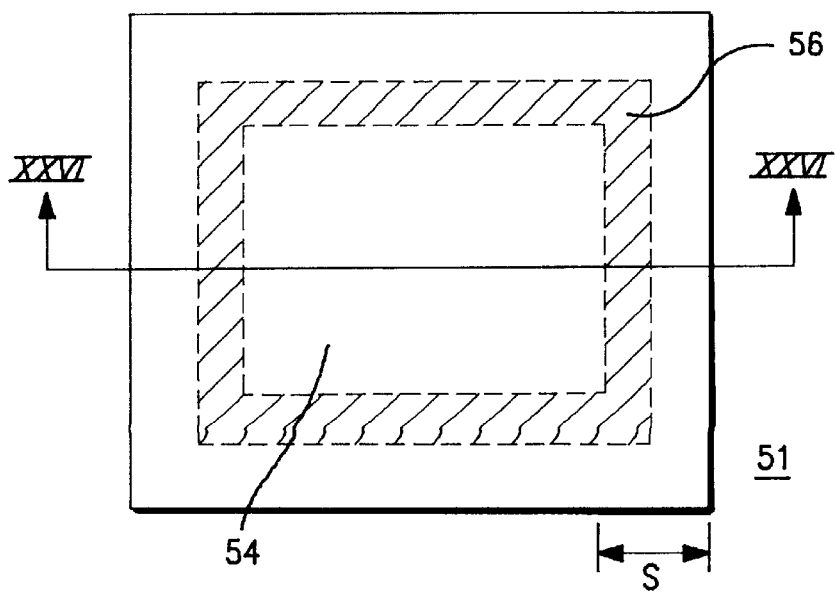
FIG. 25 is a top plan view illustrating a multi-layered printed circuit board in accordance with the seventh embodiment of the present invention.
Figure 26:
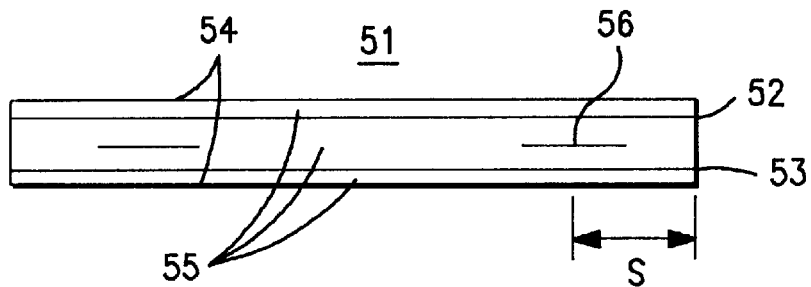
FIG. 26 is a cross-sectional view taken along the line XXVI—XXVI in FIG. 25.

FIGS. 25 and 26 illustrate a printed circuit board 51 in accordance with the seventh embodiment. As illustrated in FIG. 26, the printed circuit board 51 includes four metal layers 52, 53, 54, 54 and three dielectric layers 55. The metal layers 52, 53, 54, 54 and dielectric layers 55 are alternately deposited one on another. Specifically, each of the dielectric layers 55 is sandwiched between the metal layers 52, 53, 54, 54. The metal layers 52, 53, 54, 54 are formed by field plating so as to form a circuit pattern. The dielectric layers 55 are made of insulating material such as glass epoxy and paper phenol. The first and fourth metal layers act as a wiring layer 54 in which a signal pattern is formed, and the second and third layers act as a ground layer 52 and a power-supplying layer 53, respectively.

The printed circuit board 51 includes a magnetic layer 56 formed in the dielectric layer 55 sandwiched between the ground layer 52 and the power-supplying layer 53. As illustrated in FIG. 25, the magnetic layer 56 forms a rectangular loop. The magnetic layer 56 includes a magnetic loss, and has a center at about a distance S from an edge of the printed circuit board 51 in a lengthwise direction of the printed circuit board 51. Herein, the distance S is defined as one-fourth of a wavelength associated with a target frequency at which EMI and circuit malfunction occur.

Though the magnetic layer 56 is formed only in the dielectric layer 55 sandwiched between the ground layer 52 and the power-supplying layer 53 in the above-mentioned embodiment, the magnetic layer 56 may be formed in all the dielectric layers 55 of the printed circuit board 51. In addition, the magnetic layer 56 may be formed so as to occupy an area having a outer boundary spaced away from an outer edge of the printed circuit board 51 by the distance S. Namely, the magnetic layer 56 may be coextensive with an area surrounded by a hatched area in FIG. 25.

The sixth embodiment may be applied to a printed circuit board having six, eight or the greater number of metal layers.

Figure 27:
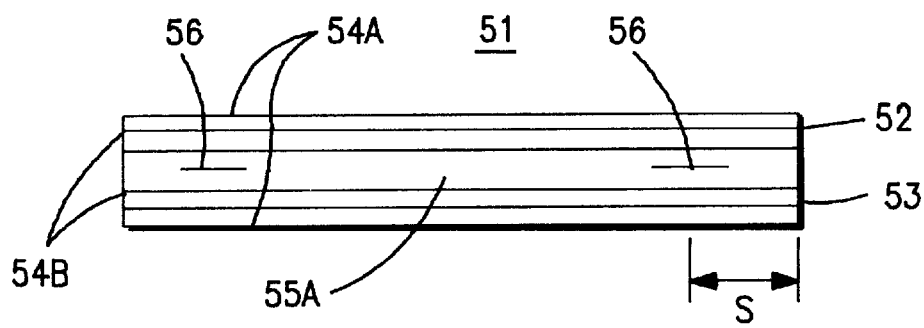
FIG. 27 is a cross-sectional view taken along the line XXVI—XXVI in FIG. 25, of a variation of the seventh embodiment.

For instance, as illustrated in FIG. 27, in a printed circuit board including first, third, fourth and sixth metal layers as wiring layers 54A and 54B in which a signal pattern is formed, a second metal layer as a ground layer 52, and a fifth layer as a power-supplying layer 53, the magnetic film 56 may be formed in at least one or all of the dielectric layers 55A sandwiched between the ground layer 52 and the power-supplying layer 53.

As an alternative, the wiring layers 54B sandwiched between the ground layer 52 and the power-supplying layer 53 may be replaced partially with the magnetic film 56 having a magnetic loss.

The magnetic layer 56 may be made of a magnetic thin film such as a Fe-based alloy thin film having a magnetic loss at high frequency band. For instance, the magnetic layer 56 may be made of $Fe_{55}Hf_{11}O_{34}$ or $Fe_{67}Dy_7O_{26}$. As an alternative, the magnetic layer 56 may be made of a layer on which a magnetic thin film is deposited, sintered ferrite in the form of a layer, or a sheet in which power having a magnetic loss, such as ferrite, is dispersed.

Hereinbelow is explained the reason why the printed circuit board in accordance with the seventh embodiment can prevent EMI and malfunction of a circuit caused by intrusion of external electromagnetic field.

Figure 28:
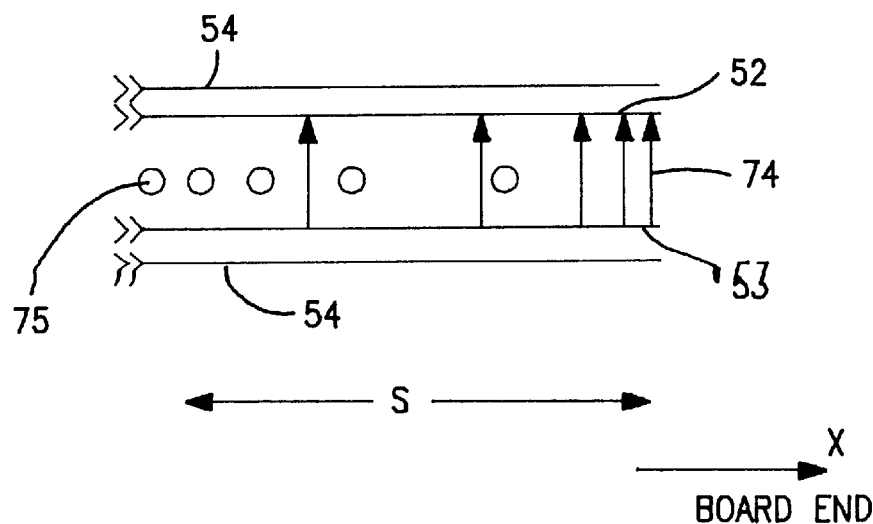
FIG. 28 is a schematic view illustrating lines of electric force and lines of magnetic force at a marginal end of a substrate.

FIG. 28 is an enlarged view of a marginal end of the printed circuit board. Lines 74 of electric force run from the power-supplying layer 53 to the ground layer 52, and lines 75 of magnetic force run in parallel with the ground layer 52 and the power-supplying layer 53.

As mentioned earlier, resonance occurs in the parallel plate path formed between the ground layer 52 and the power-supplying layer 53. The intensity of magnetic field is zero and the intensity of electric field is maximum both at an end of a printed circuit board. As is obvious in view of the theory of a transfer path, the magnetic field intensity is maximum and the electric field intensity is zero at the distance S of a quarter of an internal wavelength in the board, measured from an end of the board which is an open end, as illustrated in FIG. 18. Accordingly, it is possible to efficiently depress the above-mentioned resonance by putting magnetic loss at a location defined by the distance S.

As illustrated in FIG. 28, the lines 75 of magnetic force is oriented in parallel with the ground layer 52 and the power-supplying layer 53. Hence, the magnetic loss of the magnetic layer 56 may be efficiently utilized by forming the magnetic layer 56 in parallel with the ground and power-supplying layers 52 and 53 both of which are in turn in parallel with the lines 75 of magnetic force.

It is not always necessary to design the magnetic layer 56 to be located at the distance S from an edge of the printed circuit board 51. The magnetic layer 56 may be designed to be coextensive with the printed circuit board 51, in which case, the magnetic film 56 provides almost no advantageous effect at the marginal end of the printed circuit board, because the magnetic field intensity is almost zero at the marginal end of the printed circuit board, as mentioned above. However, since it is no longer necessary to form the magnetic film 56 only in a limited area, the printed circuit board 51 may be fabricated more readily or in the smaller number of fabrication steps.

Eighth Embodiment

Figure 29:
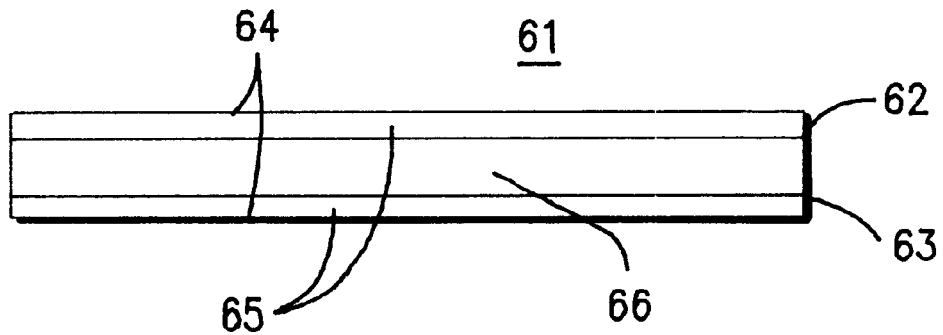
FIG. 29 is a cross-sectional view of a multi-layered printed circuit board in accordance with the eighth embodiment.
Figure 30:
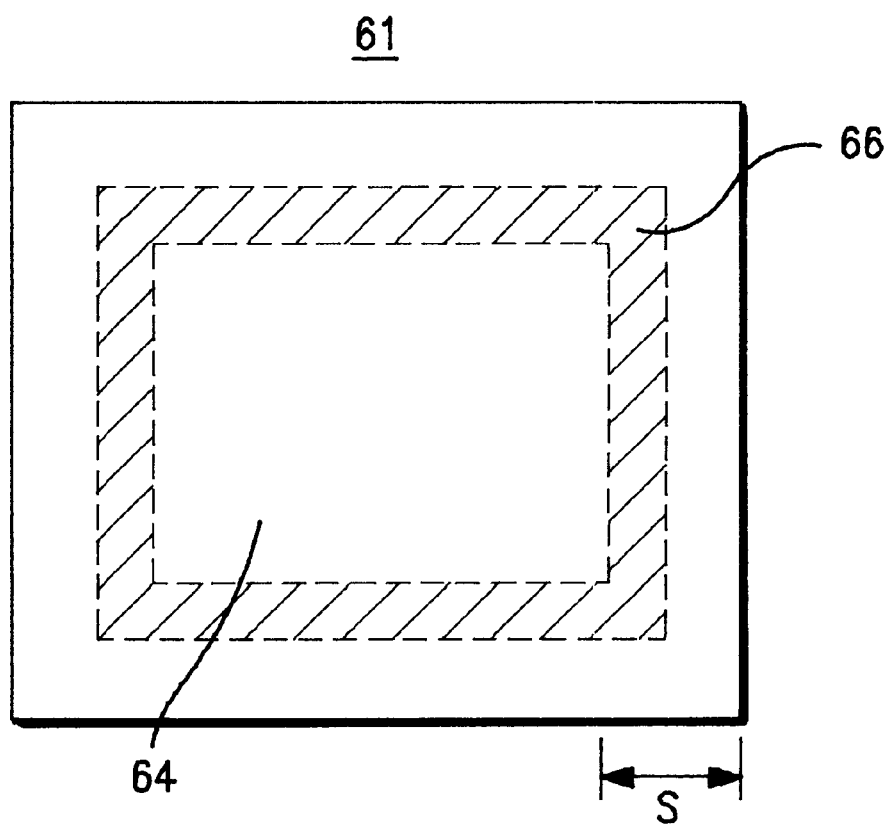
FIG. 30 is a top plan view of a variation of the multi-layered printed circuit board in accordance with the eighth embodiment.

FIGS. 29 and 30 illustrate a printed circuit board 61 in accordance with the eighth embodiment. As illustrated in FIG. 29, the printed circuit board 61 includes four metal layers 62, 63, 64, 64 and two dielectric layers 65. The first and fourth metal layers act as a wiring layer 64 in which a signal pattern is formed, and the second and third layers act as a ground layer 62 and a power-supplying layer 63, respectively. The metal layers 62, 63, 64, 64 are formed by field plating so as to form a circuit pattern. The upper dielectric layer 65 is sandwiched between the first or uppermost metal layer 64 and the ground layer 62, and the lower dielectric layer 65 is sandwiched between the fourth or lowermost metal layer 64 and the power-supplying layer 63. The dielectric layers 65 are made of insulating material such as glass epoxy and paper phenol.

An electrically insulating layer 66 having a magnetic loss is sandwiched between the ground layer 62 and the power-supplying layer 63 in electrical insulation with the layers 62 and 63.

In accordance with the eighth embodiment, resonance occurring in a parallel plate path defined by the ground layer 62 and the power-supplying layer 63 is attenuated by the magnetic loss of the insulating layer 66, resulting in that it is possible to prevent EMI and malfunction of a circuit caused by intrusion of external electromagnetic field thereinto.

As mentioned earlier, the magnetic loss of the insulating layer 66 is most useful at the distance of a quarter of the wavelength from an edge of the printed circuit board, where the magnetic field intensity is in maximum. Accordingly, as illustrated in FIG. 30, it is preferable that the insulating layer 66 is designed to have a certain width a center of which is located at the distance S from an outer edge of the printed circuit board 61. As mentioned earlier, the distance S is defined as one-fourth of a wavelength, measured in the printed circuit board, associated with a target frequency at which EMI and circuit malfunction occur. As an alternative, the insulating layer 66 may be designed to be coextensive with an area having a boundary spaced away from the edge of the printed circuit board 61 by the distance S, namely, an area surrounded by the hatched area in FIG. 30.

It is preferable that the insulating layer 66 having a magnetic loss is made of polymer, such as epoxy resin, in which magnetic material having a magnetic loss in high frequency band, such as ferrite and carbonyl iron, is dispersed in the form of powder or filler.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-342180 filed on Dec. 20, 1996 including specification, claims, drawings and summary is incorporated herein by reference in its entirety.

What is claimed is:

1. A printed circuit board comprising:
   (a) at least one dielectric layer;
   (b) at least two metal layers one of which acts as a ground layer, another one of which acts as a power-supplying layer, and the others of which, if any, act as a wiring layer in which a signal pattern is formed, said dielectric layer and said metal layers being alternately formed one on another; and
   (c) at least one resistor disposed at a marginal end of said printed circuit board between said ground layer and said power-supplying layer, said resistor having a function of disallowing d.c. current communication between said ground layer and said power-supplying layer.

2. The printed circuit board as set forth in claim 1, wherein said resistor has no electrical communication with said ground layer and said power-supplying layer.

3. The printed circuit board as set forth in claim 1, wherein said resistor has electrical communication with only one of said ground layer and said power-supplying layer.

4. The printed circuit board as set forth in claim 1, wherein said power-supplying layer is comprised of a plurality of sections, and wherein said resistor is arranged at a marginal end of each of said sections.

5. The printed circuit board as set forth in claim 1, wherein a plurality of wiring layers are sandwiched between said ground layer and said power-supplying layer, signal patterns of said wiring layers being formed in a limited area within said wiring layers, said resistor being formed outside said limited area between said ground layer and said power-supplying layer.

6. The printed circuit board as set forth in claim 1, wherein said resistor has a closed shape extending along an entire outer edge of said printed circuit board.

7. A printed circuit board comprising:
   (a) at least one dielectric layer;
   (b) at least two metal layers one of which acts as a ground layer, another one of which acts as a power-supplying layer, and the others of which, if any, act as a wiring layer in which a signal pattern is formed, said dielectric layer and said metal layers being alternately formed one on another; and
   (c) a multi-layered structure disposed at a marginal end of said printed circuit board between said ground layer and said power-supplying layer, said multi-layered structure having a function of disallowing d.c. current communication between said ground layer and said power-supplying layer, said multi-layered structure comprising a compound layer and a dielectric layer both of which are alternately deposited, said compound layer comprising a resistive layer, and metal layers sandwiching said resistive layer therebetween.

8. The printed circuit board as set forth in claim 7, wherein said multi-layered structure has no electrical communication with said ground layer and said power-supplying layer.

9. The printed circuit board as set forth in claim 7, wherein said multi-layered structure has electrical communication with only one of said ground layer and said power-supplying layer.

10. The printed circuit board as set forth in claim 7, wherein said power-supplying layer is comprised of a plurality of sections, and wherein said multi-layered structure is arranged at a marginal end of each of said sections.

11. The printed circuit board as set forth in claim 1, wherein said multi-layered structure has a closed shape extending along an entire outer edge of said printed circuit board.

12. A printed circuit board comprising:
   (a) at least one dielectric layer;
   (b) at least two metal layers one of which acts as a ground layer, another one of which acts as a power-supplying layer, and the others of which, if any, act as a wiring layer in which a signal pattern is formed, said dielectric layer and said metal layers being alternately formed one on another;
   (c) a resistive film extending from an upper surface to a lower surface through a sidewall of said printed circuit board;
   (d) pads formed on said upper and lower surfaces of said printed circuit board; and
   (e) a capacitor formed on one of said upper and lower surfaces of said printed circuit board,
   said ground layer and said power-supplying layer being in electrical communication with each of said pads through via-holes at a marginal end of said printed circuit board,
   said resistive film being in electrical communication with one of said pads through said capacitor, and being in direct electrical communication with the other of said pads.

13. The printed circuit board as set forth in claim 12, further comprising an additional capacitor formed on the other of said upper and lower surfaces of said printed circuit board, said resistive film being in electrical communication with said pads through said capacitor and said additional capacitor, respectively.

14. The printed circuit board as set forth in claim 12, further comprising a short-circuit board formed on the other of said upper and lower surfaces of said printed circuit board, said resistive film being in electrical communication with said pads through said capacitor and said short-circuit board, respectively.

15. The printed circuit board as set forth in claim 12, wherein said capacitor has a parasitic inductance small enough to prevent reduction in current running through said resistive film.

16. A printed circuit board comprising:
   (a) at least one dielectric layer;
   (b) at least two metal layers one of which acts as a ground layer, another one of which acts as a power-supplying layer, and the others of which, if any, act as a wiring layer in which a signal pattern is formed, said dielectric layer and said metal layers being alternately formed one on another;
   (c) a resistor formed on a sidewall of said printed circuit board;
   (d) pads formed on upper and lower surfaces of said printed circuit board; and
   (e) a capacitor formed on one of said upper and lower surfaces of said printed circuit board,
   said ground layer and said power-supplying layer being in electrical communication with each of said pads through via-holes at a marginal end of said printed circuit board,
   said resistor being in electrical communication with one of said pads through said capacitor, and being in direct electrical communication with the other of said pads.

17. The printed circuit board as set forth in claim 16, further comprising an additional capacitor formed on the other of said upper and lower surfaces of said printed circuit board, said resistor being in electrical communication with said pads through said capacitor and said additional capacitor, respectively.

18. The printed circuit board as set forth in claim 16, further comprising a short-circuit board formed on the other of said upper and lower surfaces of said printed circuit board, said resistor being in electrical communication with said pads through said capacitor and said short-circuit board, respectively.

19. The printed circuit board as set forth in claim 16, wherein said capacitor has a parasitic inductance small enough to prevent reduction in current running through said resistor.

20. A printed circuit board comprising:
(a) at least one dielectric layer;
(b) at least two metal layers one of which acts as a ground layer, another one of which acts as a power-supplying layer, and the others of which, if any, act as a wiring layer in which a signal pattern is formed, said dielectric layer and said metal layers being alternately formed one on another;
(c) two pads formed on a common surface among upper and lower surfaces of said printed circuit board;
(d) a resistor disposed on said common surface of said printed circuit board; and
(e) a capacitor formed on said common surface of said printed circuit board,
said ground layer and said power-supplying layer being in electrical communication with each of said pads through via-holes at a marginal end of said printed circuit board,
said resistor and said capacitor being electrically connected in series with each other between said pads.

21. The printed circuit board as set forth in claim 20, wherein one of said ground layer and said power-supplying layer, located above the other, is formed with an electrically insulating region so that one of said via-holes electrically connecting the other of said ground layer and said power-supplying layer to one of said pads makes no electrical communication with said one of said ground layer and said power-supplying layer.

22. The printed circuit board as set forth in claim 20, further comprising a third pad disposed between said resistor and said capacitor for electrically connecting said resistor and said capacitor in series with each other.

23. A printed circuit board comprising:
(a) at least one dielectric layer;
(b) at least two metal layers one of which acts as a ground layer, another one of which acts as a power-supplying layer, and the others of which, if any, act as a wiring layer in which a signal pattern is formed, said dielectric layer and said metal layers being alternately formed one on another, said power-supplying layer comprising a plurality of sections;
(c) two pads formed on a common surface among upper and lower surfaces of said printed circuit board for each of said sections of said power-supplying layer;
(d) a resistor disposed on said common surface of said printed circuit board for each of said sections of said power-supplying layer; and
(e) a capacitor formed on said common surface of said printed circuit board for each of said sections of said power-supplying layer,
said ground layer and said power-supplying layer being in electrical communication with each of said pads through via-holes at a marginal end of each of said sections,
said resistor and said capacitor being electrically connected in series with each other between said pads.

24. The printed circuit board as set forth in claim 23, wherein one of said ground layer and said power-supplying layer, located above the other, is formed with an electrically insulating region so that one of said via-holes electrically connecting the other of said ground layer and said power-supplying layer to one of said pads makes no electrical communication with said one of said ground layer and said power-supplying layer.

25. The printed circuit board as set forth in claim 23, further comprising a third pad disposed between said resistor and said capacitor for electrically connecting said resistor and said capacitor in series with each other.

26. A printed circuit board comprising:
(a) at least one dielectric layer;
(b) at least two metal layers one of which acts as a ground layer, another one of which acts as a power-supplying layer, and the others of which, if any, act as a wiring layer in which a signal pattern is formed, said dielectric layer and said metal layers being alternately formed one on another;
(c) a plurality of pad-pairs formed on a common surface among upper and lower surfaces of said printed circuit board at a marginal end thereof, adjacent pad-pairs being spaced away from each other by a distance W defined as a half or smaller of a wavelength associated with an upper limit frequency within a frequency band to be suppressed;
(d) resistors disposed on said common surface of said printed circuit board; and
(e) capacitors formed on said common surface of said printed circuit board,
each of said ground layer and said power-supplying layer being in electrical communication with a pad in each of said pad-pairs through a via-hole at a marginal end of said printed circuit board,
each of said resistors and each of said capacitors being electrically connected in series with each other between pads in each of said pad-pairs.

27. A printed circuit board comprising:
(a) at least one dielectric layer;
(b) at least two metal layers one of which acts as a ground layer, another one of which acts as a power-supplying layer, and the others of which, if any, act as a wiring layer in which a signal pattern is formed, said dielectric layer and said metal layers being alternately formed one on another, said power-supplying layer comprising a plurality of sections;
(c) a plurality of pad-pairs formed on a common surface among upper and lower surfaces of said printed circuit board for each of said sections of said power-supplying layer, adjacent pad-pairs being spaced away from each other by a distance W defined as a half or smaller of a wavelength associated with an upper limit frequency within a frequency band to be suppressed;
(d) resistors disposed on said common surface of said printed circuit board for each of said sections of said power-supplying layer; and
(e) capacitors formed on said common surface of said printed circuit board for each of said sections of said power-supplying layer,
each of said ground layer and said power-supplying layer being in electrical communication with a pad in each of said pad-pairs through a via-hole at a marginal end of each of said sections,
each of said resistors and each of said capacitors being electrically connected in series with each other between pads in each of said pad-pairs.

28. A printed circuit board comprising:
(a) at least one dielectric layer;
(b) at least two metal layers one of which acts as a ground layer, another one of which acts as a power-supplying layer, and the others of which, if any, act as a wiring layer in which a signal pattern is formed, said dielectric layer and said metal layers being alternately formed one on another; and (c) a magnetic layer formed in said dielectric layer sandwiched between said ground layer and said power-supplying layer, said magnetic layer including a magnetic loss and having a center located at about a distance S measured from an edge of said printed circuit board in a lengthwise direction of said printed circuit board, said distance S being defined as one-fourth of a wavelength associated with a frequency to be depressed.

29. The printed circuit board as set forth in claim 28, wherein said printed circuit board comprises a plurality of dielectric layers between said ground layer and said power-supplying layer, and wherein said magnetic layer is formed in all of said dielectric layers.

30. The printed circuit board as set forth in claim 28, wherein said printed circuit board comprises a magnetic film in place of said magnetic layer, said magnetic film being formed as a part of said wiring layer, including a magnetic loss, and having a center located at about a distance S measured from an edge of said printed circuit board in a lengthwise direction of said printed circuit board, said distance S being defined as one-fourth of a wavelength associated with a frequency to be depressed.

31. The printed circuit board as set forth in claim 28, wherein said magnetic layer is formed in parallel with both said ground layer and said power-supplying layer.

32. A printed circuit board comprising:
   (a) at least one dielectric layer;
   (b) at least two metal layers one of which acts as a ground layer, another one of which acts as a power-supplying layer, and the others of which, if any, act as a wiring layer in which a signal pattern is formed, said dielectric layer and said metal layers being alternately formed one on another; and
   (c) a magnetic layer formed in said dielectric layer sandwiched between said ground layer and said power-supplying layer, said magnetic layer including a magnetic loss and occupying an area having an outer boundary spaced away from an edge of said printed circuit board by a distance S, said distance S being defined as one-fourth of a wavelength associated with a frequency to be depressed.

33. The printed circuit board as set forth in claim 32, wherein said printed circuit board comprises a plurality of dielectric layers between said ground layer and said power-supplying layer, and wherein said magnetic layer is formed in all of said dielectric layers.

34. The printed circuit board as set forth in claim 32, wherein said printed circuit board comprises a magnetic film in place of said magnetic layer, said magnetic film being formed as a part of said wiring layer, including a magnetic loss, and occupying said area.

35. The printed circuit board as set forth in claim 32, wherein said magnetic layer is formed in parallel with both said ground layer and said power-supplying layer.

36. A printed circuit board comprising:
   (a) at least one dielectric layer;
   (b) at least two metal layers one of which acts as a ground layer, another one of which acts as a power-supplying layer, and the others of which, if any, act as a wiring layer in which a signal pattern is formed, said dielectric layer and said metal layers being alternately formed one on another; and
   (c) a magnetic layer formed between said ground layer and said power-supplying layer, said magnetic layer including a magnetic loss and coextending with said printed circuit board.

37. The printed circuit board as set forth in claim 36, wherein said magnetic layer is formed in parallel with both said ground layer and said power-supplying layer.

38. A printed circuit board comprising:
   (a) at least one dielectric layer;
   (b) at least two metal layers one of which acts as a ground layer, another one of which acts as a power-supplying layer, and the others of which, if any, act as a wiring layer in which a signal pattern is formed, said dielectric layer and said metal layers being alternately formed one on another; and
   (c) an electrically insulating layer formed between said ground layer and said power-supplying layer, said electrically insulating layer including a magnetic loss.

39. The printed circuit board as set forth in claim 35, wherein said electrically insulating layer has a center thereof in a lengthwise direction of said printed circuit board, located at about a distance S measured from an edge of said printed circuit board in a lengthwise direction of said printed circuit board, said distance S being defined as one-fourth of a wavelength associated with a frequency to be depressed.

40. The printed circuit board as set forth in claim 35, wherein said electrically insulating layer occupies an area having an outer boundary spaced away from an edge of said printed circuit board by a distance S, said distance S being defined as one-fourth of a wavelength associated with a frequency to be depressed.

* * * * *